US009933915B2

(12) United States Patent
Covington et al.

(10) Patent No.: US 9,933,915 B2
(45) Date of Patent: Apr. 3, 2018

(54) METHODS AND SYSTEMS FOR DISPLAYING VEHICLE DATA PARAMETER GRAPHS IN DIFFERENT DISPLAY ORIENTATIONS

(71) Applicant: Snap-on Incorporated, Kenosha, WI (US)

(72) Inventors: Joshua Covington, San Juan Bautista, CA (US); April Reynald, San Diego, CA (US)

(73) Assignee: Snap-on Incorporated, Kenosha, WI (US)

( * ) Notice: Subject to any disclaimer, the term of this patent is extended or adjusted under 35 U.S.C. 154(b) by 580 days.

(21) Appl. No.: 14/531,474

(22) Filed: Nov. 3, 2014

(65) Prior Publication Data
US 2016/0124609 A1    May 5, 2016

(51) Int. Cl.
*G06T 11/20*    (2006.01)
*G06F 3/0481*    (2013.01)
(Continued)

(52) U.S. Cl.
CPC .......... *G06F 3/04817* (2013.01); *G01M 15/02* (2013.01); *G01M 17/00* (2013.01);
(Continued)

(58) Field of Classification Search
CPC ............ G07C 5/008; G09G 2340/0492; G06T 11/60; G06T 11/206; G01R 13/345
(Continued)

(56) References Cited

U.S. PATENT DOCUMENTS 4,686,331 A    8/1987   Burgess
6,025,833 A    2/2000   Duff
(Continued)

FOREIGN PATENT DOCUMENTS

EP    2698054 A2    2/2014

OTHER PUBLICATIONS

International Searching Authority, Written Opinion of the International Searching Authority, regarding International application No. PCT/US2015/058809, dated Jan. 29, 2016, 8 pages.
(Continued)

*Primary Examiner* — Ke Xiao
*Assistant Examiner* — Andrew Shin
(74) *Attorney, Agent, or Firm* — McDonnell Boehnen Hulbert & Berghoff LLP

(57) ABSTRACT

Methods and system pertaining to displaying vehicle data parameters (VDP) are described. A vehicle service tool (VST) with a display can receive vehicle data messages or signals from a vehicle to receive the VDP. Some of the VDP can be associated with a PID. The VST can display VDP thresholds and indicators when a received VDP has breached a VDP threshold. The VST can determine being changed from a landscape orientation to a portrait orientation or vice versa and responsively change the presentation of VDP graphs displayed by the display. The display can receive various inputs such as a drag-and-drop or pinch-and-expand input to alternatively change the presentation of the VDP graphs being displayed. Changing a VDP presentation of graphs can include resizing or repositioning one or more VDP graph windows including a VDP graph.

18 Claims, 21 Drawing Sheets

(51) Int. Cl.
*G06F 9/44* (2018.01)
*G07C 5/00* (2006.01)
*G06F 3/0482* (2013.01)
*G06F 3/0484* (2013.01)
*G06F 3/0486* (2013.01)
*G06F 3/0488* (2013.01)
*G01M 15/02* (2006.01)
*G01M 17/00* (2006.01)
*G01R 31/00* (2006.01)
*G06F 1/16* (2006.01)

(52) U.S. Cl.
CPC ......... *G01R 31/006* (2013.01); *G06F 1/1694* (2013.01); *G06F 3/0481* (2013.01); *G06F 3/0482* (2013.01); *G06F 3/0486* (2013.01); *G06F 3/0488* (2013.01); *G06F 3/04842* (2013.01); *G06F 3/04886* (2013.01); *G07C 5/008* (2013.01); *G06F 2200/1614* (2013.01); *G06F 2200/1637* (2013.01); *G06F 2203/04803* (2013.01); *G07C 2205/02* (2013.01)

(58) Field of Classification Search
USPC ......... 345/649, 650, 659, 440, 440.1, 440.2; 701/29.1
See application file for complete search history.

(56) References Cited

U.S. PATENT DOCUMENTS

| | | | |
|---|---|---|---|
| 6,377,965 B1 | 4/2002 | Hachamovitch et al. | |
| 6,590,568 B1 | 7/2003 | Astala et al. | |
| 6,781,587 B2 | 8/2004 | Grigor | |
| 8,245,143 B2 | 8/2012 | Yach et al. | |
| 8,255,238 B2 | 8/2012 | Powell et al. | |
| 8,539,384 B2 | 9/2013 | Hinckley et al. | |
| 8,601,019 B1 | 12/2013 | Weininger et al. | |
| 8,645,825 B1 | 2/2014 | Cornea et al. | |
| 2004/0172177 A1 | 9/2004 | Nagai et al. | |
| 2006/0026521 A1 | 2/2006 | Hotelling et al. | |
| 2009/0144622 A1 | 6/2009 | Evans et al. | |
| 2010/0070931 A1 | 3/2010 | Nichols | |
| 2010/0083154 A1 | 4/2010 | Takeshita | |
| 2011/0035094 A1 | 2/2011 | Van Den Berg et al. | |
| 2011/0078624 A1 | 3/2011 | Missig et al. | |
| 2011/0102464 A1 | 5/2011 | Godavari | |
| 2011/0113363 A1* | 5/2011 | Hunt | G06F 3/0481 715/800 |
| 2011/0163969 A1 | 7/2011 | Anzures et al. | |
| 2012/0047458 A1 | 2/2012 | Alberry et al. | |
| 2012/0260203 A1 | 10/2012 | Commarford et al. | |
| 2012/0272186 A1 | 10/2012 | Kraut | |
| 2012/0316984 A1 | 12/2012 | Glassman | |
| 2012/0323402 A1 | 12/2012 | Murakami | |
| 2013/0021377 A1* | 1/2013 | Doll | G09G 5/14 345/649 |
| 2013/0145279 A1* | 6/2013 | Ricci | G06F 9/54 715/746 |
| 2013/0147849 A1 | 6/2013 | Kwak et al. | |
| 2013/0155069 A1 | 6/2013 | Borders et al. | |
| 2014/0033103 A1 | 1/2014 | Boyer et al. | |
| 2014/0053092 A1 | 2/2014 | Grevinga et al. | |
| 2014/0071171 A1 | 3/2014 | McGowan et al. | |
| 2014/0075356 A1 | 3/2014 | Gray et al. | |
| 2014/0075362 A1 | 3/2014 | Gray et al. | |
| 2014/0149940 A1 | 5/2014 | Li et al. | |
| 2014/0173530 A1 | 6/2014 | Mesguich Havilio et al. | |
| 2014/0245232 A1 | 8/2014 | Bailiang | |
| 2014/0277908 A1 | 9/2014 | Fish et al. | |
| 2014/0281868 A1 | 9/2014 | Vogel et al. | |
| 2015/0007078 A1 | 1/2015 | Feng et al. | |
| 2015/0039176 A1 | 2/2015 | Fish | |
| 2016/0034153 A1 | 2/2016 | Lejeune et al. | |
| 2016/0048305 A1* | 2/2016 | Singal | G06F 3/04845 715/765 |
| 2017/0010016 A1 | 1/2017 | Saito et al. | |

OTHER PUBLICATIONS

International Searching Authority, International Search Report, regarding International application No. PCT/US2015/058809, dated Jan. 29, 2016, 5 pages.
U.S. Appl. No. 14/531,562, filed Nov. 3, 2014; inventors: Joshua Covington, April Reynald.
U.S. Appl. No. 14/531,607, filed Nov. 3, 2014; inventors: Joshua Covington, April Reynald.
U.S. Appl. No. 14/531,649, filed Nov. 3, 2014; inventors: Joshua Covington, April Reynald.
U.S. Appl. No. 14/531,686, filed Nov. 3, 2014; inventors: Joshua Covington, April Reynald.

* cited by examiner

METHODS AND SYSTEMS FOR DISPLAYING VEHICLE DATA PARAMETER GRAPHS IN DIFFERENT DISPLAY ORIENTATIONS

BACKGROUND

Most vehicles are serviced at least once during their useful life. In many instances, a vehicle is serviced at a facility with professional mechanics (e.g., technicians). The technicians may use any of a variety of hand tools to service (e.g., repair) any of the wide variety of mechanical components on a vehicle. The technicians may also use electronic diagnostic equipment to service (e.g., diagnose) any of the wide variety of electrical components on a vehicle. The technician may also use the hand tools to service an electrical component and use the electronic diagnostic equipment to service a mechanical component on a vehicle.

Overview

Several example embodiments are described herein. In one respect, an example embodiment can take the form of a method comprising: (i) determining, by a processor, a display is operating in a first display orientation, wherein the first display orientation is associated with the display displaying vehicle data parameter (VDP) graphs using a first VDP graph configuration, (ii) displaying, by the display, a first set of multiple VDP graphs using the first VDP graph configuration while the display is positioned in the first display orientation, (iii) determining, by the processor, the display changing from operating in the first display orientation to operating in a second display orientation that is different than the first display orientation, wherein the second display orientation is associated with the display displaying at least one VDP graph using a second VDP graph configuration different than the first VDP graph configuration, and (iv) displaying, by the display, at least one VDP graph using the second VDP graph configuration while the display is operating in the second display orientation.

In another respect, an example embodiment can take the form of a system comprising: a processor, a computer-readable medium storing computer-readable program instructions executable by the processor; and a display, wherein the computer-readable program instructions are executable by the processor to (i) determine the display is operating in a first display orientation, wherein the first display orientation is associated with the display displaying vehicle data parameters (VDP) graphs using a first VDP graph configuration, (ii) display, by the display, a first set of multiple VDP graphs using the first VDP graph configuration while the display is positioned in the first display orientation, (iii) determine the display changing from operating in the first display orientation to operating in a second display orientation that is different than the first display orientation, wherein the second display orientation is associated with the display displaying at least one VDP graph using a second VDP graph configuration different than the first VDP graph configuration, and (iv) display, by the display, at least one VDP graph using the second VDP graph configuration while the display is operating in the second display orientation.

In another respect, an example embodiment can take the form of a computer-readable medium storing program instructions, that when executed by a processor, cause a set of functions to be performed, the set of functions comprising: (i) determining, by the processor, a display is operating in a first display orientation, wherein the first display orientation is associated with the display displaying vehicle data parameter (VDP) graphs using a first VDP graph configuration, (ii) displaying, by the display, a first set of multiple VDP graphs using the first VDP graph configuration while the display is positioned in the first display orientation, (iii) determining, by the processor, the display changing from operating in the first display orientation to operating in a second display orientation that is different than the first display orientation, wherein the second display orientation is associated with the display displaying at least one VDP graph using a second VDP graph configuration different than the first VDP graph configuration, and (iv) displaying, by the display, at least one VDP graph using the second VDP graph configuration while the display is operating in the second display orientation.

In another respect, an example embodiment can take the form of a method comprising: (i) receiving, by a device, a selection of a vehicle operating condition detectable by the device, (ii) receiving, by the device, vehicle data parameters, (iii) determining, by the device from among the vehicle data parameters, a first instance of a particular vehicle data parameter that indicates occurrence of the vehicle operating condition, (iv) displaying, by the device, a graphical representation of at least a portion of the vehicle data parameters received by the device, and (v) displaying, by the device, a first indicator that corresponds to the first instance of the particular vehicle data parameter that indicates occurrence of the vehicle operating condition.

In another respect, an example embodiment can take the form of a system comprising: a processor, a computer-readable medium storing computer-readable program instructions executable by the processor, a display, and a user interface input element, wherein execution of the program instructions causes the processor to (i) receive a selection of a detectable vehicle operating condition, (ii) receive vehicle data parameters, and (iii) determine, from among the vehicle data parameters, a first instance of a particular vehicle data parameter that indicates occurrence of the vehicle operating condition, wherein the display displays a graphical representation of at least a portion of the received vehicle data parameters, and wherein the display displays a first indicator that corresponds to the first instance of the particular vehicle data parameter that indicates occurrence of the vehicle operating condition.

In another respect, an example embodiment can take the form of a computer-readable medium storing program instructions, that when executed by a processor, cause a set of functions to be performed, the set of functions comprising: (i) receiving, by the processor, a selection of a vehicle operating condition detectable by the processor, (ii) receiving, by the processor, vehicle data parameters, (iii) determining, by the processor from among the vehicle data parameters, a first instance of a particular vehicle data parameter that indicates occurrence of the vehicle operating condition, (iv) displaying, by a display, a graphical representation of at least a portion of the vehicle data parameters received by the processor, and (v) displaying, by the display, a first indicator that corresponds to the first instance of the particular vehicle data parameter that indicates occurrence of the vehicle operating condition.

In another respect, an example embodiment can take the form of a method comprising: (i) receiving, by a device, multiple vehicle data parameters associated with a first vehicle data parameter (VDP) identifier and multiple vehicle data parameters associated with a second VDP identifier, (ii) displaying, by a display of the device, a first graphical representation showing at least a portion of the vehicle data parameters associated with the first VDP identifier at a first display position of the display, (iii) displaying, by the display of the device, a second graphical representation showing at least a portion of the vehicle data parameters associated with the second VDP identifier at a second display position of the display, and (iv) receiving, by the device, a drag-and-drop input of the first graphical representation displayed at the first display position onto at least a portion of the second display position displaying the second graphical representation and responsively changing the graphical representations displayed at the first display position and the second display position, wherein changing the graphical representations displayed at the first display position and the second display position includes switching the second display position to display the first graphical representation instead of the second graphical representation.

In another respect, an example embodiment can take the form of a system comprising: a processor, a computer-readable medium storing computer-readable program instructions executable by the processor, and a display, wherein execution of the program instructions causes (i) the processor to receive multiple vehicle data parameters associated with a first vehicle data parameter (VDP) identifier and multiple vehicle data parameters associated with a second VDP identifier, (ii) a display to display a first graphical representation showing at least a portion of the vehicle data parameters associated with the first VDP identifier at a first display position of the display, (iii) the display to display a second graphical representation showing at least a portion of the vehicle data parameters associated with the second VDP identifier at a second display position of the display, and (iv) the processor to receive a drag-and-drop input of the first graphical representation displayed at the first display position onto at least a portion of the second display position displaying the second graphical representation and responsively changing the graphical representations displayed at the first display position and the second display position, and wherein changing the graphical representations displayed at the first display position and the second display position includes switching the second display position to display the first graphical representation instead of the second graphical representation.

In another respect, an example embodiment can take the form of a computer-readable medium storing program instructions, that when executed by a processor, cause a set of functions to be performed, the set of functions comprising: (i) receiving, by the processor, multiple vehicle data parameters associated with a first vehicle data parameter (VDP) identifier and multiple vehicle data parameters associated with a second VDP identifier, (ii) displaying, by a display, a first graphical representation showing at least a portion of the vehicle data parameters associated with the first VDP identifier at a first display position of the display, (iii) displaying, by the display, a second graphical representation showing at least a portion of the vehicle data parameters associated with the second VDP identifier at a second display position of the display, and (iv) receiving, by the processor, a drag-and-drop input of the first graphical representation displayed at the first display position onto at least a portion of the second display position displaying the second graphical representation and responsively changing the graphical representations displayed at the first display position and the second display position, wherein changing the graphical representations displayed at the first display position and the second display position includes switching the second display position to display the first graphical representation instead of the second graphical representation.

In another respect, an example embodiment can take the form of a method comprising: (i) receiving, by a device, multiple vehicle data parameters associated with a first vehicle data parameter (VDP) identifier and multiple vehicle data parameters associated with a second VDP identifier, (ii) displaying, by a display of the device, a first VDP graph showing at least a portion of the vehicle data parameters associated with the first VDP identifier, (iii) displaying, by the display of the device, a second VDP graph showing at least a portion of the vehicle data parameters associated with the second VDP identifier, and (iv) receiving, by the device, a pinch-and-expand input of the first VDP graph and responsively increasing a size of the first VDP graph.

In another respect, an example embodiment can take the form of a system comprising: (i) a device to receive multiple vehicle data parameters associated with a first vehicle data parameter (VDP) identifier and multiple vehicle data parameters associated with a second VDP identifier, (ii) a display to display a first VDP graph showing at least a portion of the vehicle data parameters associated with the first VDP identifier and a second VDP graph showing at least a portion of the vehicle data parameters associated with the second VDP identifier, (iii) an input device to receive a pinch-and-expand input of the first VDP graph, (iv) a processor, and (v) a computer-readable medium storing computer-readable program instructions executable by the processor to increase a size of the first VDP graph in response to receipt of the pinch-and-expand input of the first VDP graph.

In another respect, an example embodiment can take the form of a computer-readable medium storing program instructions, that when executed by a processor, cause a set of functions to be performed, the set of functions comprising: (i) receiving, by a device, multiple vehicle data parameters associated with a first vehicle data parameter (VDP) identifier and multiple vehicle data parameters associated with a second VDP identifier, (ii) displaying, by a display of the device, a first VDP graph showing at least a portion of the vehicle data parameters associated with the first VDP identifier, (iii) displaying, by the display of the device, a second VDP graph showing at least a portion of the vehicle data parameters associated with the second VDP identifier, and (iv) receiving, by the device, a pinch-and-expand input of the first VDP graph and responsively increasing a size of the first VDP graph In another respect, an example embodiment can take the form of a method comprising: (i) displaying, by a display of a device, a plurality of vehicle data parameter (VDP) graphs within the display, wherein each VDP graph includes at least one cursor, (ii) displaying, by the display, a cursor positioner within the display, wherein the cursor positioner is configured for a cursor positioner movement that causes a uniform movement of at least one cursor within each VDP graph, (iii) determining, by the device, an occurrence of the cursor positioner movement, and (iv) moving uniformly, by the device, the at least one cursor within each VDP graph in response to determining the occurrence of the cursor positioner movement.

In another respect, an example embodiment can take the form of a system comprising: a display, a processor, and a computer-readable medium storing computer-readable program instructions, wherein the display is configured to display a plurality of vehicle data parameter (VDP) graphs within the display, wherein each VDP graph includes at least one cursor, wherein the display is configured to display a cursor positioner that is configured for a cursor positioner movement that causes a uniform movement of at least one cursor within each VDP graph, and wherein the program instructions are executable by the processor to determine an occurrence of the cursor positioner movement, and to move uniformly the at least one cursor within each VDP graph in response to determining the occurrence of the cursor positioner movement.

In another respect, an example embodiment can take the form of a computer-readable medium storing program instructions, that when executed by a processor, cause a set of functions to be performed, the set of functions comprising: (i) displaying, by a display of a device, a plurality of vehicle data parameter (VDP) graphs within the display, wherein each VDP graph includes at least one cursor, (ii) displaying, by the display, a cursor positioner within the display, wherein the cursor positioner is configured for a cursor positioner movement that causes a uniform movement of at least one cursor within each VDP graph, (iii) determining, by the device, an occurrence of the cursor positioner movement, and (iv) moving uniformly, by the device, the at least one cursor within each VDP graph in response to determining the occurrence of the cursor positioner movement.

These as well as other aspects and advantages will become apparent to those of ordinary skill in the art by reading the following detailed description, with reference where appropriate to the accompanying drawings. Further, it should be understood that the embodiments described in this overview and elsewhere are intended to be examples only and do not necessarily limit the scope of the invention.

BRIEF DESCRIPTION OF THE DRAWINGS

Example embodiments are described herein with reference to the drawings.

DETAILED DESCRIPTION

I. Introduction

This description describes several example embodiments including, but not limited to, example embodiments that pertain to at least one of displaying vehicle data parameter graph windows, displaying vehicle data parameter graphs, and displaying vehicle data parameters. As an example, the vehicle data parameters can be obtained from a vehicle in the form of a vehicle data message (e.g., a serial data message). As another example, the vehicle data parameters can be obtained from a vehicle in the form of an electrical signal using an input element. The VDP displayed graphically, or otherwise, by an example vehicle service tool, can include VDP obtained by a vehicle data message, the input element, or otherwise.

In this description, the articles "a," "an" or "the" are used to introduce elements of the example embodiments. The intent of using those articles is that there is one or more of the elements. The intent of using the conjunction "or" within a described list of at least two terms is to indicate any of the listed terms or any combination of the listed terms. The use of ordinal numbers such as "first," "second," "third" and so on is to distinguish respective elements rather than to denote a particular order of those elements.

The diagrams, flow charts, and other data shown in the figures are provided merely as examples and are not intended to be limiting. Many of the elements illustrated in the figures or described herein are functional elements that can be implemented as discrete or distributed components or in conjunction with other components, and in any suitable combination and location. Those skilled in the art will appreciate that other arrangements and elements (e.g., machines, interfaces, functions, orders, or groupings of functions) can be used instead. Furthermore, various functions described as being performed by one or more elements can be carried out by a processor executing computer-readable program instructions (CRPI) or by any combination of hardware, firmware, or software. Furthermore still, identical reference numbers used in the same or different figures denote elements that are identical to other elements referred to by the same reference number, but those denoted elements and the other elements are no so limited.

II. Example Systems

Figure 1:
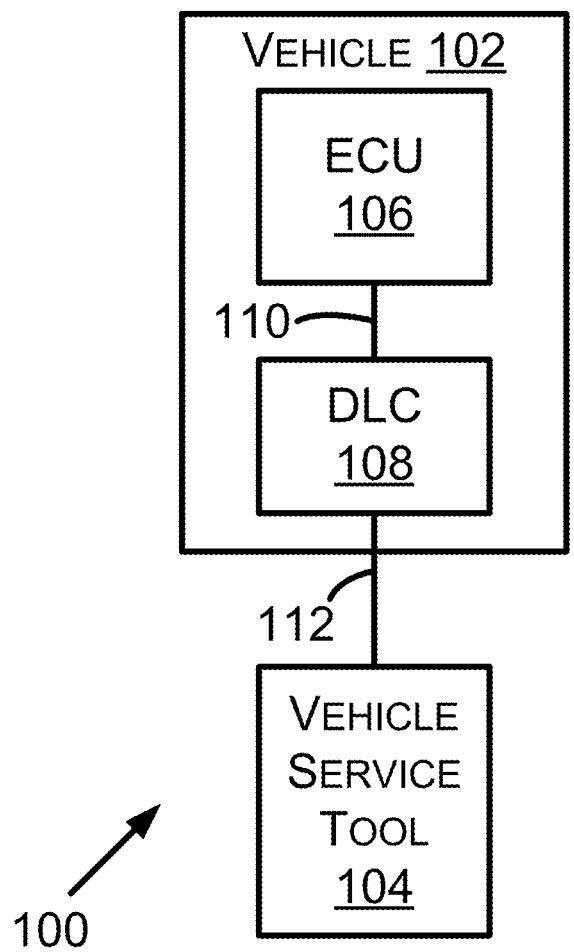
FIG. 1 is a block diagram of a system in accordance with the example embodiments.

FIG. 1 is a block diagram of a system 100 in accordance with the example embodiments described herein. The system 100 includes a vehicle 102 having an electronic control unit (ECU) 106 and a data link connector (DLC) 108. The ECU 106 and the DLC 108 can be communicatively connected to one another by a vehicle communication link 110.

A vehicle, such as vehicle 102, can include an automobile, a motorcycle, a light-duty truck, a medium-duty truck, a heavy-duty truck, a semi-tractor, a farm machine, or some other equipment that can be driven or otherwise guided along a path (e.g., a paved road or otherwise) on land, in water, or in the air or outer space. A vehicle can include or use any appropriate voltage or current source, such as a battery, an alternator, a fuel cell, and the like, providing any appropriate current or voltage, such as about 12 volts, about 42 volts, and the like. A vehicle can include or use any desired system or engine. Those systems or engines can include items that use fossil fuels, such as gasoline, natural gas, propane, and the like, electricity, such as that generated by a battery, magneto, fuel cell, solar cell and the like, wind and hybrids or combinations thereof.

The vehicle communication link 110 can include one or more conductors (wired or otherwise) or can be wireless. As an example, the vehicle communication link 110 can include one or two conductors for carrying vehicle data messages in accordance with a vehicle data message (VDM) protocol. A VDM protocol can include, but is not limited to, a Society of Automotive Engineers (SAE) J1850 (PWM or VPW) VDM protocol, an International Organization of Standardization (ISO) 15764-4 controller area network (CAN) VDM protocol, an ISO 9141-2 K-Line VDM protocol, or an ISO 14230-4 KWP2000 K-Line VDM protocol. As another example, the vehicle communication link 110 can include a vehicle serial data bus.

The DLC 108 can include an on-board diagnostics (OBD) II connector. An OBD II connector can include slots for retaining up to 16 connector terminals, but the DLC 108 is not so limited. The DLC 108 can include conductor terminals that connect to a conductor in the vehicle 102. For instance, the DLC 108 can include connector terminals that connect to conductors that respectively connect to positive and negative terminals of a vehicle battery. The DLC 108 can include one or more conductor terminals that connect to a conductor of the vehicle communication link 110 such that the DLC 108 is communicatively connected to the ECU 106.

The ECU 106 can control various aspects of vehicle operation or components within the vehicle 102. For example, the ECU 106 can include a powertrain system ECU, an engine ECU, a supplemental inflatable restraint system (i.e., an air bag system) ECU, an entertainment system ECU, or some other ECU. The ECU 106 can receive inputs (e.g., a sensor input), control output devices (e.g., a solenoid), generate a vehicle data message (VDM) (such as a VDM based on a received input or a controlled output), and set a diagnostic trouble code (DTC) as being active or history for a detected fault or failure condition within the vehicle 102.

Two or more ECU, such as the ECU 106 and a second ECU in the vehicle 102, can send a VDM to each other and receive a VDM from the other ECU. Transmission of a VDM can occur over the vehicle communication link 110. In that way, a VDM can be transmitted to the DLC 108. A VDM can include data such as, but not limited to, any one or more of (i) an ECU identifier, (ii) a parameter identifier (PID), (iii) a mode identifier that identifies a current data mode, a freeze frame data mode, a vehicle information mode, a DTC mode, or some other mode, and (iv) a parameter value. As an example, a VDM that indicates the engine revolutions per minute (RPM) of an engine within the vehicle 102 can comprise the hexadecimal data "41 0C 0F A0," where "41" represents a response to a mode 01 request, "0C" is a PID indicating engine RPM, and "0F A0" is the parameter value representing the RPM (¼ RPM per bit). In this case, the hexadecimal value "0F A0" equals 4,000. At ¼ RPM per bit, the engine RPM represented by the example VDM is 1,000 RPM.

The system 100 includes a vehicle service tool (VST) 104. The VST 104 can be communicatively connected to the vehicle 102 (e.g., to the DLC 108 within the vehicle 102) by way of a communication link 112. The VST 104 can operate using electrical power provided to it from the vehicle battery by way of the DLC 108, but the VST 104 is not so limited. For example, the VST 104 may include its own power source, such as a battery, or the VST 104 may receive electrical power for its operation from a power source other than the vehicle 102 or an internal battery, such as an alternating current power available at a wall outlet.

The communication link 112 can include one or more conductors (wired or otherwise) or can be wireless. The communication link 112 can include a harness with one or more conductors and a connector that connects to a mating connector on the VST 104 and to the wires within the harness, but the communication link 112 is not so limited. The harness and mating connectors can be configured like a DB-25 connector, but are not so limited.

In accordance with examples in which a communication link, such as communication link 112 or any other communication means described herein, communicates data wirelessly, such wireless communication of data can be carried out in accordance with a wireless communication protocol (e.g., a wireless communication standard). As an example, a wireless communication protocol can be an Institute of Electrical and Electronics Engineers (IEEE) 802.15.1 standard for wireless personal area networks (PANs) or a Bluetooth version 4.1 standard developed by the Bluetooth Special Interest Group (SIG) of Kirkland, Wash. As another example, the wireless communication protocol can be an IEEE 802.11 standard for wireless LANs, which is sometimes referred to as a Wi-Fi standard. As another example, the wireless communication protocol can be a cellular phone standard, such as standard for 3G or 4G cellular phone communications developed by the $3^{rd}$ Generation Partnership Project (3GPP). Other examples of a wireless communication protocol are also possible.

Figure 2:
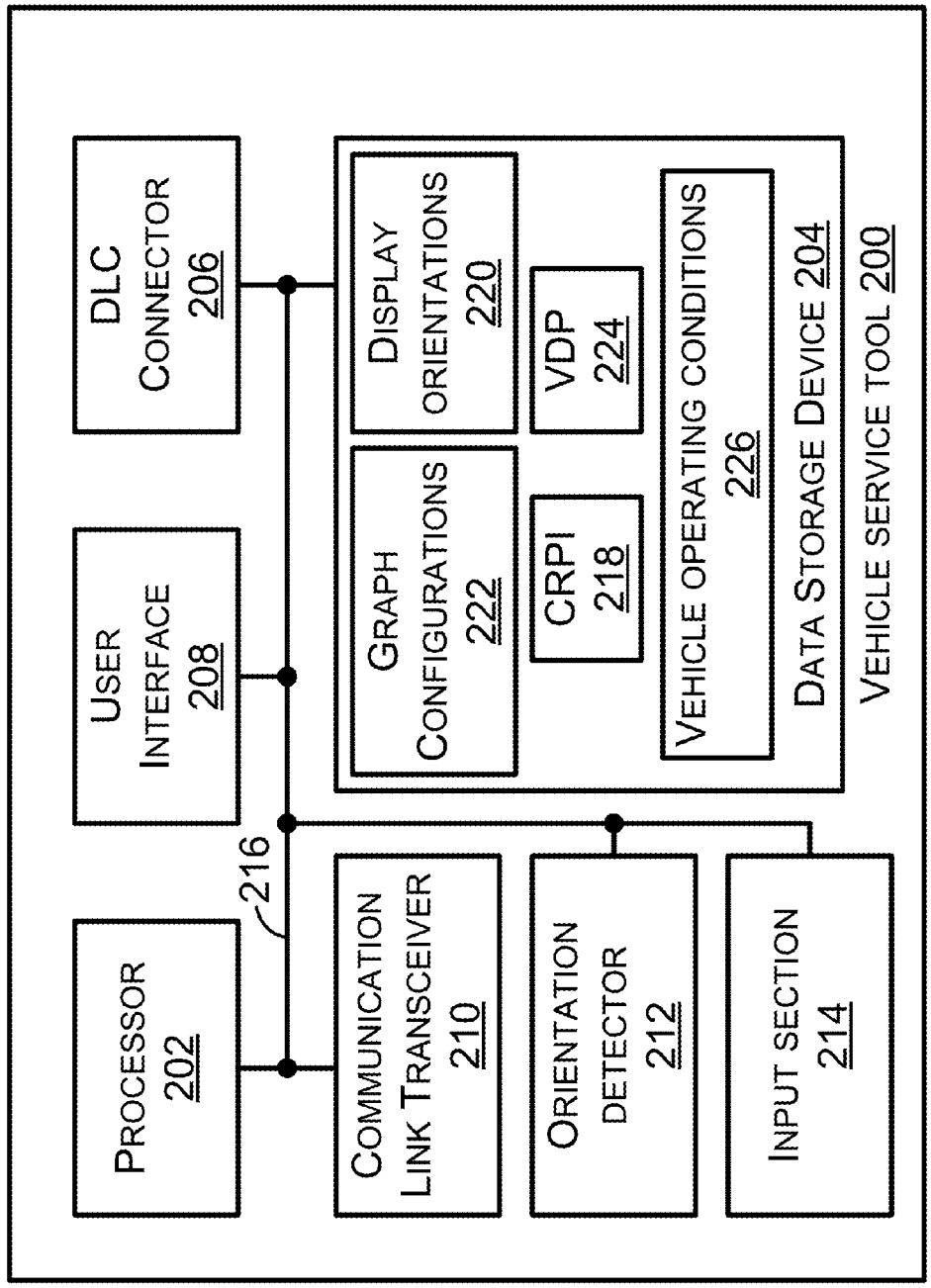
FIG. 2 is a block diagram of a vehicle service tool (VST) in accordance with the example embodiments.
Figure 3:
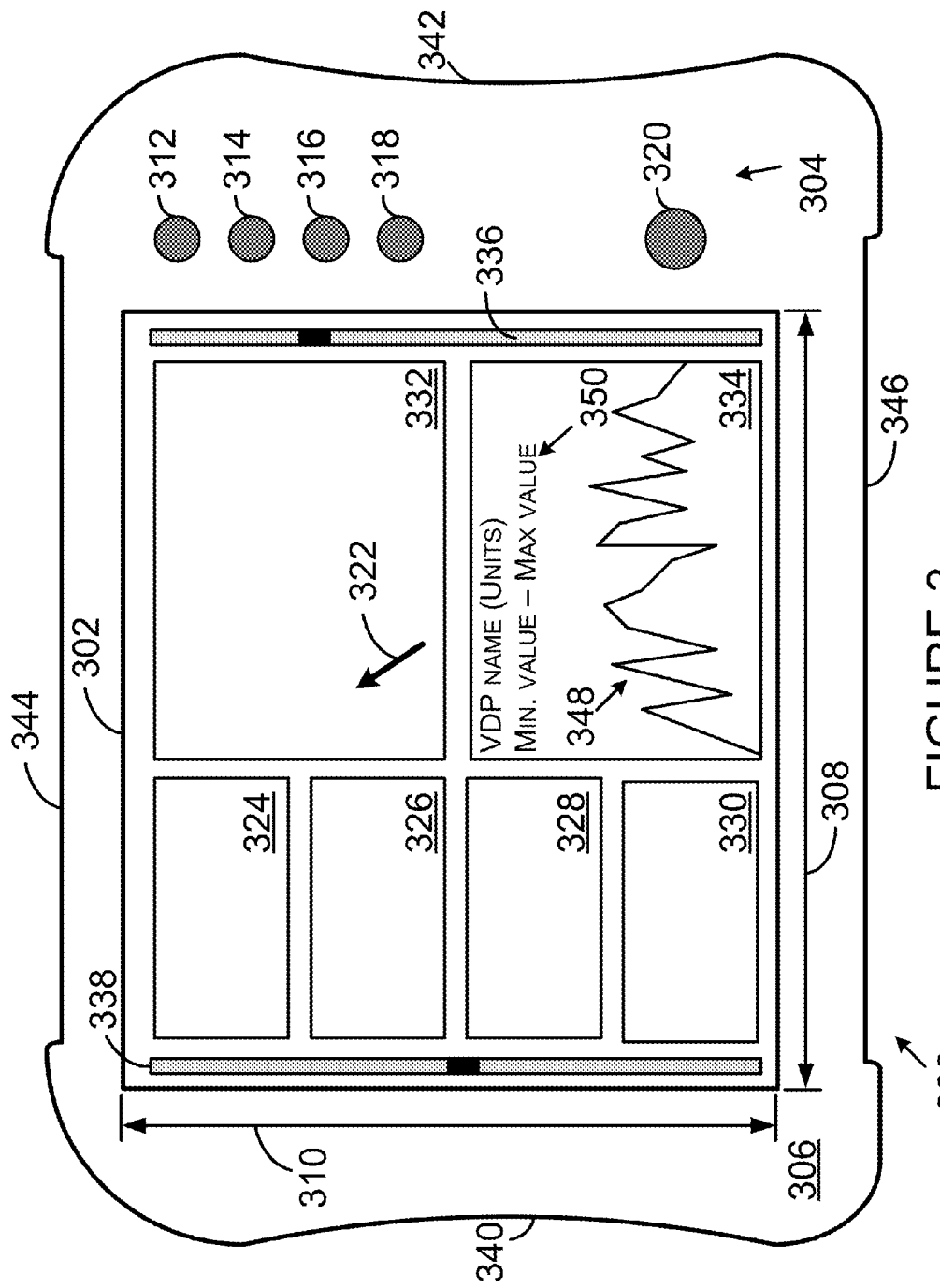
FIG. 3 is a diagram of an example VST with a display in accordance with the example embodiments.

Next, FIG. 2 is a block diagram of a vehicle service tool (VST) 200 in accordance with the example embodiments described herein. The VST 200 can operate within the system 100 in place of, or in addition to, the VST 104, but is not so limited. The VST 104 can be arranged like the VST 200. The VST 104 can include the VST 200 or any one or more of the components thereof. One or more of the components of the VST 200 can be arranged as a device or system. A device or system can include one or more of the components of the VST 200. A VST 300 is shown in FIG. 3. The VST 200 can include any one or more of the components of the VST 300, but is not so limited.

The VST 200 includes a processor 202, a data storage device 204, a DLC connector 206, a user interface 208, a communication link transceiver 210, an orientation detector 212, and an input section 214, two or more of which can be communicatively coupled or linked together via a system bus, network, or other connection mechanism 216.

A processor, such as processor 202 or any other processor discussed in this description, can include one or more general purpose processors (e.g., INTEL® single core microprocessors or INTEL® multicore microprocessors) or one or more special purpose processors (e.g., digital signal processors). Additionally or alternatively, a processor can include an application specific integrated circuit (ASIC). Processor 202 can be configured to execute computer-readable program instructions (CRPI), such as the CRPI 218 shown in FIG. 2.

A data storage device, such as data storage device 204 or any other data storage device discussed in this description, can include a computer-readable medium. A computer-readable medium can include a non-transitory computer-readable medium readable by a processor. A computer-readable medium can include volatile or non-volatile storage components, such as optical, magnetic, organic or other memory or disc storage, which can be integrated in whole or in part with a processor, or which can be separate from a processor. A computer readable medium can include, but is not limited to, a random-access memory (RAM), a read-only memory (ROM), a programmable read-only memory (PROM), an erasable programmable read-only memory (EPROM), an electrically erasable programmable read-only memory (EEPROM), a compact disk read-only memory (CD-ROM), or any other device that is capable of providing data or executable instructions that may be accessed by a processor, such as processor 202.

Additionally or alternatively, a computer-readable medium can include a transitory computer-readable medium. The transitory computer-readable medium can include, but is not limited to, a communications medium such as a digital or analog communications medium (e.g., a fiber optic cable, a waveguide, a wired communication link, or a wireless communication link).

A computer-readable medium can be referred to by other terms such as, but not limited to, a "computer-readable storage medium," a "data storage device," a "memory device," or a "memory." Data storage device 204 can be referred to as a "computer-readable data storage device" and a "computer-readable medium."

The DLC connector 206 can communicatively connect the VST 200 to the vehicle 102. This communicative connection allows the VST 200 to transmit messages (e.g., a VDM request) to the vehicle 102, and to receive messages (e.g., VDM) from the vehicle 102. In one respect, the communicative connection can be carried out using wired conductors of the communication link 112. For instance, the DLC connector 206 can include a connector with terminals that are connectable to terminals within the DLC 108 by way of one or more conductors. As an example, the DLC connector 206 can include an OBD II connector that meets the SAE J1962 specification such as a connector 16M, part number 12110252, available from Delphi Automotive LLP of Troy, Mich. In another respect, the communicative connection between the VST 200 and the vehicle 102 can be carried out using a wireless connection of the communication link 112. For instance, the DLC connector 206 can include a wireless transceiver to transmit VDM to and receive VDM from a version of the DLC 108 configured for wireless communication of VDM. The DLC connector 206 can transmit a VDM it receives to one or more of the processor 202, the data storage device 204, the user interface 208, and the communication link transceiver 210 over the connection mechanism 216.

The user interface 208 can include user-input elements configured so that a user of VST 200 can input data for use by the processor 202 or another element of the VST 200. As an example, the user-input elements can include a touch screen display. As another example, the user-input elements can include a user input section (e.g., the user input section 304 shown in FIG. 3) having one or more input keys. As another example, the user-input elements can include a pointing device such as a computing device mouse, a keyboard (e.g., a QWERTY keyboard), a display pointer (e.g. the display pointer 322 shown in FIG. 3), or a microphone for receiving spoken inputs.

The user interface 208 can include user-output elements configured for outputting (e.g., presenting) data to a user of the VST 200. As an example, the user-output elements can include a display device (or more simply, a "display") for visual presentation of data, such as VDP graph windows or any element of a display presentation described herein, but is not so limited. As another example, the user-output elements can include an audio speaker to audibly present data to a user of the VST 200. For instance, the audible data can include sounds (e.g., sound waves of a constant frequency) to alert a user to various warnings and prompts associated with use of the VST 200. As another example, the audible data can include text-to-speech content of at least a portion of data displayed by the display.

The communication link transceiver 210 can include one or more transceivers. In one respect, the one or more transceivers can include a wireless transceiver and one or more antennas to carry out wireless communications according to a wireless communication protocol. In another respect, the one or more transceivers can include a wired transceiver to carry out communications over a wired communication link in accordance with a communication protocol such as, but not limited to, an Transmission Control Protocol/Internet Protocol (TCP/IP) or an IEEE 802.3 Ethernet communication protocol for a LAN or otherwise. The communication link transceiver 210 can establish a communicative connection with a device off-board (e.g., remote from) the VST 200 and the vehicle 102, but is not so limited.

The orientation detector 212 can detect a change in an orientation that the VST 200 or a component thereof can take or be positioned. As an example, the orientations of a display 302 (shown in FIG. 3) can be referred to as a landscape orientation (e.g., an image displayed by the display 302 is wider than it is tall) or a portrait orientation (e.g., an image displayed by the display 302 is taller than it is wide). The orientation detector 212 can include one or more accelerometers or a multi-axis gyroscope, but is not so limited. The processor 202 can execute program instructions of the CRPI 218 to determine a current orientation of the VST component or a change in the orientation of the VST component. The processor 202 can execute additional program instructions in response to determining a change in orientation of the VST component so as to cause one or more changes in VST operation. Examples of these changes are discussed elsewhere herein.

The input section 214 can include input leads and an input signal processing element that converts input signals obtained by the input leads into input data. The input leads can include one or more input leads, each of which can receive input signals from an input signal acquisition point (ISAP). The input signal acquisition point may comprise any of a variety of locations at which an input signal can be acquired. In the vehicle 102, an ISAP can include a location on the vehicle at which a voltage signal, current signal, air pressure signal, air temperature signal, oil pressure signal, oil temperature signal, or some other input signal can be acquired.

As an example, an input lead can include, but is not limited to, a conductor and one or more conductor ends selected from among (i) an alligator clip, such as an MTA85 alligator clip sold by Snap-on Incorporated, Kenosha, Wis., United States, (ii) a spring hook, such as an MTA80 spring hook sold by Snap-on Incorporated, (iii) a test probe, such as an MTA20 test probe sold by Snap-on Incorporated, or (iv) a back-probe, such as an MTTL7005 back-probe sold by Snap-on Incorporated.

The input section 214 can include an input signal processing element, such as an analog-to-digital converter (ADC) that converts an input signal received via one or more input leads into input data that is displayable at the display 302. Each of those input signals can include an analog electrical signal, but is not so limited. A digital output of the ADC can be transferred to another element of the VST 200 (e.g., the processor 202, the data storage device 204, or the user interface 208) via connection mechanism 216.

The data storage device 204 can store various data. For example, the data storage device 204 can store the CRPI 218, display orientations 220, graph configurations 222, vehicle data parameters 224, and vehicle operating conditions 226, but the data storage device 204 is not so limited.

The display orientations 220 can include data regarding various orientations in which a display of the VST 200 (e.g., a display 302 shown in FIG. 3) can take or be positioned. The display orientations 220 can track changes in an orientation of the display 302. The display orientations 220 can include data that indicates a current orientation of the display 302. As an example, the orientations of the display can be referred to as a landscape orientation (e.g., a displayed image is wider than it is tall) or a portrait orientation (e.g., a displayed image is taller than it is wide).

The display orientations 220 can also include data regarding characteristics or settings of the display 302. These display characteristics or settings can includes, but are not limited to, any one or more of a screen display resolution, a pixel density, and physical dimensions (e.g., a width and length) of the display 302. The processor 202 can determine how VDP graph windows are to be displayed for a given display characteristic or setting. For example, the processor 202 can determine that a width of the display 302 embodied in a smart phone is below a threshold width such that only one VDP graph window is to be displayed when the smart phone is switched to a landscape orientation. The width threshold may be set such that the width of a typical tablet device is greater than the width threshold. In such cases, the processor 202 can determine switching a typical tablet device to the landscape orientation and displaying multiple VDP graph windows within the display 302. any one or more of a screen display resolution, a pixel density, and physical dimensions (e.g., a width and length) of the display 302. The processor 202 can determine how many VDP graph windows are to be displayed for a given display characteristic or setting. For example, the processor 202 can determined that a width of the display 302 embodied in a smart phone is below a threshold width such that only one VDP graph window is to be displayed when the smart phone is switched to a landscape orientation. The width threshold may be set such that the width of a typical tablet device is greater than the width threshold. In such cases, the processor 202 can determine switching a typical tablet device to the landscape orientation and displaying multiple VDP graph windows within the display 302.

The graph configurations 222 can include data regarding a plurality of VDP graph configurations displayable by the display 302. Each VDP graph configuration can indicate how many VDP graph windows are to be simultaneously displayed by the display 302, a size of each VDP graph window to be displayed by the display 302, and a position in the display 302 that each VDP graph window is to be displayed. A VDP graph configuration can include metadata that indicates, or the VDP graph configuration can otherwise indicate, a display orientation that is associated with the VDP graph configuration and a respective alternate VDP graph configuration associated with an alternate display orientation.

The VDP 224 can include values of VDP (i.e., VDP values) and metadata regarding the VDP values. As an example, the metadata regarding the VDP values can include a vehicle parameter identifier (i.e., a vehicle PID), a maximum VDP value for the associated VDP values and a minimum VDP value for the associated VDP values. As another example, the metadata regarding the VDP can include a time or sequence identifier for each respective VDP value such that the user interface 208 can display a VDP graph of the VDP values in an order in which the VDP values occurred (e.g., were generated or were received). A time or sequence identifier for one or more VDP values can be implied from an order in which the VDP values are stored in the data storage device 204. For instance, the VDP values stored in consecutive data bits or bytes can indicate an order in which the VDP values occurred. As another example, the metadata regarding the VDP can include data that indicate the units (e.g., volts, percent, or counts) associated with the VDP values. As another example, a VDP can include a voltage measurement, an amperage measurement, a capacitive measurement, an inductance measurement, and a resistance measurement. One or more those measurements can be performed by the ECU 106 or the input section 214, but are not so limited.

The vehicle operating conditions (VOC) 226 can include data that is displayable by a display, such as the display 302. Each vehicle operating condition represented by the data of the VOC 226 can include a VOC that is detectable by a VST or the processor 202. As an example, the data of a detectable VOC can include a PID and one or more thresholds values of the data parameter values associated with the PID. For example, a PID "0A" can represent a fuel pressure and the VOC can include that PID and a low threshold, such as 120 kPa gauge pressure, and a high threshold, such as 510 kPa gauge pressure. The processor 202 can receive a VDM including the PID "0A" and a parameter value indicating a fuel pressure value for an operating condition pertaining the fuel pressure provided by a fuel pump in the vehicle 102. The processor 202 can compare the received parameter value to one or both thresholds associated with the PID "0A" to determine whether a low fuel pressure or high fuel pressure operating condition has been exhibited by the vehicle 102 (e.g., a VDP threshold associated with the low or high fuel pressure has been breached.).

In general, the CRPI 218, or any other CRPI described herein, include program instructions executable by a processor. Further, and in general, CRPI can include various structures, modules, or routines, but are not so limited. Further, and in general, CRPI can be written using a computer-programming language such as C++, but are not so limited.

In particular, the CRPI 218 can include program instructions executable by the processor 202 to carry out any one or more functions described herein or represented by the figures as being performed, at least in part, by a VST or a component thereof. The CRPI 218 can be executed to perform any function described herein or shown or represented in any figure as being performed by a VST or a component thereof.

As an example, the CRPI 218 can include program instructions executable to store the VDP (e.g., a PID and VDP data values) received by the VST 200. In a first respect, storage of the VDP can include storing the VDP in a first-in-first-out (FIFO) method. The FIFO method can be used to store VDP within the VDP 224 in circumstances in which a VDP threshold associated with the VDP has not been breached. In a second respect, storage of the VDP can include storing a number of VDP received prior to occurrence of a detected vehicle operating condition (VOC), the VDP received to detect the occurrence of the VOC, and a number of VDP received after detection of the VOC. In combination, these VDP can be referred to as a set of breached VOC VDP. The number of VDP received after detection of the VOC can include at least one of (i) VDP received while the VOC still exists, and (ii) VDP received while the VOC no longer exists. The VDP 224 can store a set of breached VOC VDP even after those VDP would have been deleted or overwritten using a FIFO method if they were not part of the set of breached VOC VDP.

As an example, the VDP 224 can have a capacity to store VDP associated with eight different PID received over a one hour period at a given VDP reception rate. If the stored VDP are associated with a different number of PID or are received at a different VDP reception rate, the capacity in time may be other than one hour. The capacity for storing VDP can be dependent upon the storage size of the data storage device 204. The capacity for storing VDP can be specified in units other than time. As an example, a set of breached VOC VDP can use ten percent capacity of the VDP 224. That percentage can be set to a different percent value by use of the user interface 208.

As another example, the CRPI 218 can include program instructions executable to display the VDP stored within the VDP 224. The VDP may be displayed in accordance with one of the display presentations described herein, but are not required to be displayed in such manner.

Next, FIG. 3 is a diagram of an example vehicle service tool 300 in accordance with the example embodiments. VST 104 and VST 200 can include any one or more of the described or depicted features of the VST 300, but the VST 104 and the VST 200 are not so limited. The VST 300 can operate within the system 100 in place of, or in addition to, the VST 104 or the VST 200, but the VST 300 is not so limited.

The VST 300 includes a display 302, a user input section 304, and a housing 306. The display 302 and the user input section 304 can be a part of a user interface, such as the user interface 208. As an example, the display 302 can include a touch-screen display such as a color touch screen used on the MODIS™ ultra integrated diagnostic system (reference number EEMS328W) available from Snap-on Incorporated of Kenosha, Wis. As another example, the display 302 can include a backlit color liquid crystal display (LCD) having a resistive touch screen or panel. As another example, the display 302 can include a plasma display or a light emitting diode (LED) display. As another example, the display 302 can include a display like those used as part of a tablet device (such as an IPAD® tablet device from Apple Inc., or a SAMSUNG GALAXY TAB tablet device from Samsung Electronics Co., Ltd.). As another example, the display 302 can include a display like those used on a smartphone (such as an IPHONE® smartphone from Apple Inc. of Cupertino, Calif., or a GALAXY S® smartphone from Samsung Electronics Co., Ltd. Of Maetan-Dong, Yeongtong-Gu Suwon-Si, Gyeonggi-Do, Republic of Korea). Other examples of the display 302 are also possible.

The display 302 can have a rectangular-like shape, such as a rectangle with square corners or a generally rectangular shape with rounded corners, but the display 302 is not so limited. As shown in FIG. 3, the display has a dimension 308 and a dimension 310. Dimensions 308 and 310 are perpendicular to each other. When the VST 300 is positioned as shown in FIG. 3, the dimension 308 can be referred to as a "display width" (or more simply "width") and the dimension 310 can be referred to as a "display height" (or more simply, "height").

As shown in FIG. 3, dimension 308 is greater (e.g., longer) than dimension 310. In cases in which the display 302 is positioned such that dimension 308 is horizontal and dimension 310 is vertical (such as the case shown in FIG. 3), the display 302 can be considered to be in a landscape mode (which can be referred to as a "landscape orientation"). In cases in which the display 302 is positioned such that dimension 308 is vertical and dimension 310 is horizontal, the display 302 can be considered to be in a portrait mode (which can be referred to as a "portrait orientation").

The user input section 304 can include one or more input selectors. For example, the user input section 304 can include input keys 312, 314, 316, 318, and 320. Those user input keys can be arranged in any of a variety of configurations. For instance, input key 312 can represent an up-direction selection, input key 314 can represent a right-direction selection, input key 316 can represent a down-direction selection, input key 318 can represent a left-direction selection, and input key 320 can represent an enter selection. Pressing one of the input keys 312, 314, 316, and 318 can cause a display pointer 322 to move in a direction represented by the input key being pressed. Pressing the input key 320 can cause selection of a displayed data element to which the display pointer 322 is pointing.

The user input section 304 can be used to select a vehicle operating condition from the VOC 226. The user input section 304 can be used to select a default threshold associated with the PID of the selected VOC. The user input section 304 can also be used to set a user-selected threshold associated with the PID of the selected VOC that differs from the default threshold. In that regard, the threshold associated with a PID of a selected VOC is user-configurable.

The processor 202 can execute program instructions of the CRPI 218 to cause the display 302 to display one or more vehicle data parameter graph windows. FIG. 3 shows VDP graph windows 324, 326, 328, 330, 332, and 334. The display 302 can display VDP graph windows having different sizes. With respect to the VDP graph windows shown in FIG. 3, VDP graph windows 324, 326, 328, and 330 can be referred to as small VDP graph windows and the VDP graph windows 332 and 334 can referred to as large VDP graph windows. The VDP graph windows shown in the figures have a rectangular-like shape. The area of the display 302 covered by a large VDP graph window is greater than an area of the display 302 covered by a small VDP graph window. A VDP graph window is not limited to display a VDP graphically. For example, a VDP graph window can display a VDP value as a digital value. Other examples are also possible.

A VDP graph window can include various elements. As shown in VDP graph window 334, a VDP graph window can include a VDP line graph 348 and VDP graph text 350. The VDP graph text 350 can include a name of a VDP represented by the VDP line graph 348, a units identifier that identifies the units of the VDP line graph 348 (e.g., volts, percent, or counts), a minimum value, and a maximum value. The minimum and maximum values can be restricted to the minimum and maximum values of the VDP line graph 348 currently displayed within a VDP graph window, but are not so limited. For instance, the data storage device 204 can store minimum and maximum values for one or more VDP and use those stored minimum and maximum values to populate the VDP graph text 350 when a VDP associated with minimum and maximum values is displayed by the display 302.

The processor 202 can execute program instructions of the CRPI 218 to cause the display 302 to display one or more scroll bars. As shown in FIG. 3, the display 302 displays scroll bars 336 and 338. The scroll bar 336 can be used to scroll through a set of VDP graph windows on a first side of the display 302 and the scroll bar 338 can be used to scroll through a set of VDP graph windows on a second side of the display 302. As an example, the set of VDP graph windows on the first side of the display can include the small VDP graph windows 324, 326, 328, 330, and at least one other small VDP graph window. As an example, the set of VDP graph windows on the second side of the display 302 can include the large VDP graph windows 332, 334, and at least one other large VDP graph window.

The housing 306 can provide support or protection for at least a portion of any of the components of the VST 300, which can include any one or more of the components of any other VST discussed herein (e.g., the VST 200). The housing 306 can include hand grips 340, 342, 344, and 346, but is not so limited. The housing 306 can include one or more port openings (not shown) for connecting a communication link, such as communication link 112, to the VST 300.

The VST 300 can include a front, a back opposite the front, a top, a bottom opposite the top, a left side, and a right side opposite the left side. For purposes of this description, the data visually presented by the display 302 is presented at the front of the VST 300. Accordingly, the hand grip 340 is located at the left side of the VST 300, the hand grip 342 is located at the right side of the VST 300, the hand grip 344 is located at the top of the VST 300 and the hand grip 346 is located at the bottom of the VST 300. The VST 300 can be re-oriented (e.g., by rotating the VST 300) such that the top, bottom, left side, right side, front, and back are at a different positions then as shown in FIG. 3.

One or more of the top, the bottom, the left side, or the right side of the VST 300 may be straight or straight between the corners that form parts of the top, the bottom, the left side, or the right side. The input keys 312, 314, 316, 318, and 320 are shown as being located on the front of the VST 300. One or more input keys of the user input section 304 may be located on the top, the bottom, the left side, the right side, or the back of the VST 300, but are not so limited. One or more input keys of the input section 304 can be a part of a touch screen display of the display 304.

Figure 4:
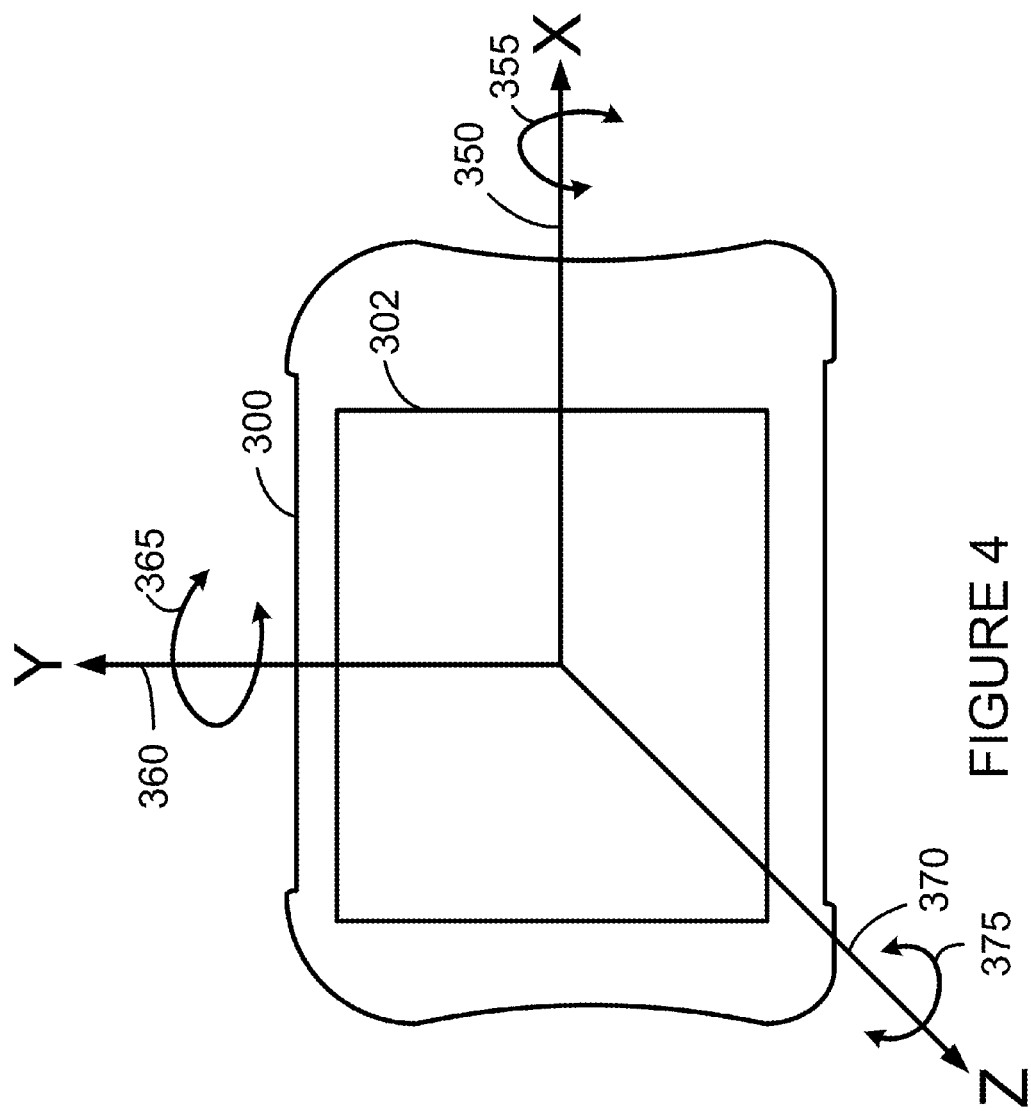
FIG. 4 is another diagram of the example VST with a display in accordance with the example embodiments.

Next, FIG. 4 is a diagram that shows example axis that can be defined for the VST 300. As shown in FIG. 4, the example axis include an "X axis" 350, a "Y axis" 360, and a "Z axis" 370. The orientation detector 212 can determine or provide signals to the processor 202 for determining a movement around one or more of the axis. As an example, the movements can be a movement 355 around the axis 350, a movement 365 around the axis 360, and a movement 375 around the axis 370.

The movement 355 can include tilting the VST 300 forward or backward. The movement 355 can be referred to as "pitch." The movement 365 can include twisting the VST 300 from side to side (e.g., a left side to a right side or the right side to the left side). The movement 365 can be referred to as "roll." The movement 375 can include turning a top of the VST 300 towards a bottom of the VST 300. The movement 375 can be referred to as "yaw." The movement 375 can cause a change in a display orientation of the VST 300 from a landscape orientation to a portrait orientation, or from the portrait orientation to the landscape orientation.

Figure 13:
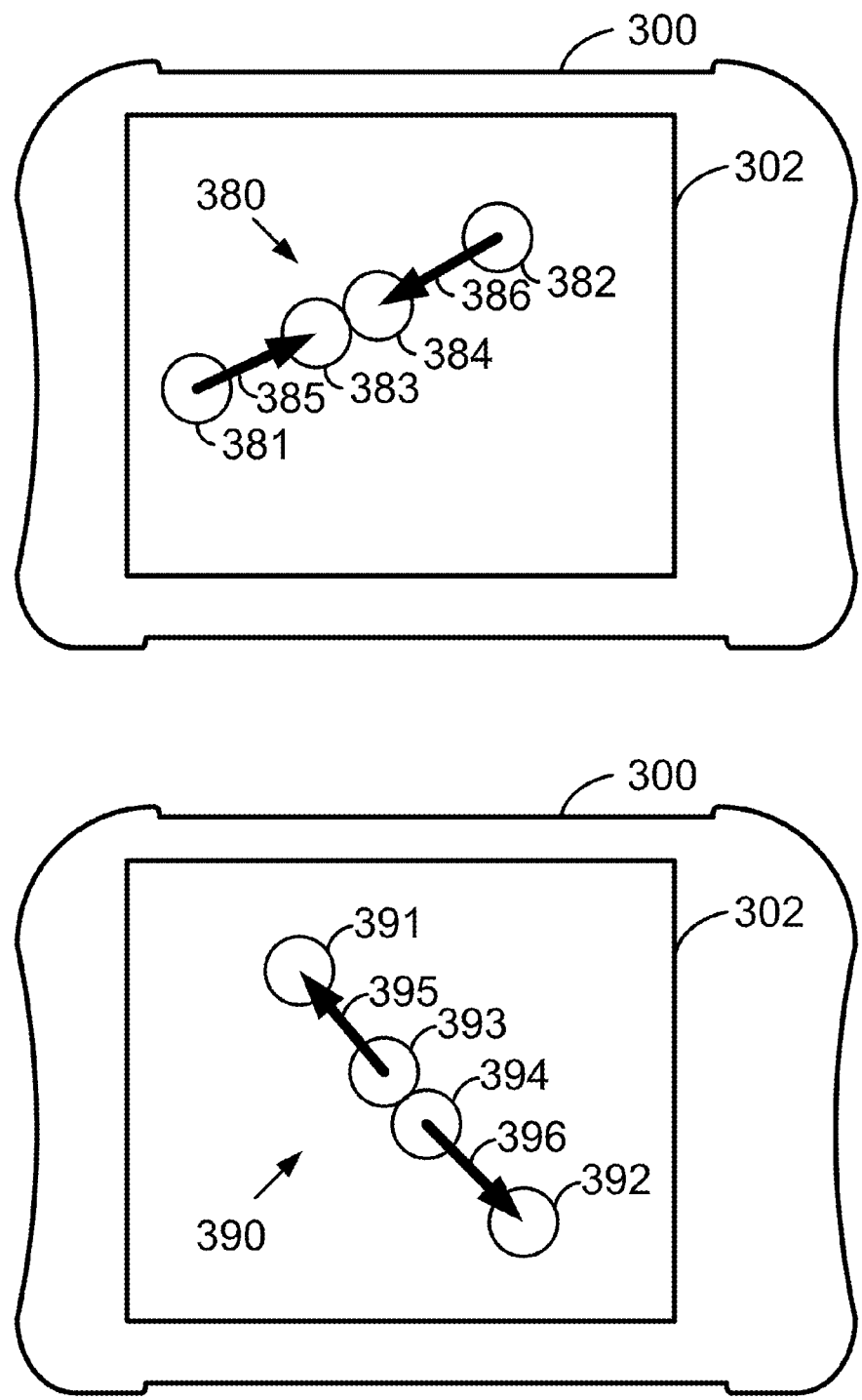
FIG. 13 is a diagram showing multiple views of the example VST with a display in accordance with the example embodiments.

Next, FIG. 13 is a diagram showing multiple views of the VST 300 with the display 302 in accordance with the example embodiments. As indicated above, the display 302 can include a touch screen display. A variety of inputs can be entered by use of the touch screen of the display 302. For example, a touch screen input can include a "selection input" of an element, such as a VDP graph window, displayed by the display 302. As another example, a touch screen input can include a "squeeze input" or a "pinch-and-zoom" input.

The top view of the display 300 in FIG. 13 shows an example of a squeeze input 380. The squeeze input 380 can include or occur by placing a first digit (e.g., a finger or thumb) at a location 381 on the display 302 and a second digit at a location 382 on the display 302, moving the first and second digits towards one another (e.g., in opposite directions 385 and 386), stopping movement of the first and second digits at a location 383 on the display 302 and a location 384 on the display 302, respectively, and removing the digits away from the display 302. The squeeze input 380 can occur within a single VDP window graph, but is not so limited. The location 381, the location 382, the location 383, and the location 384 are not limited to the locations shown in FIG. 13. Accordingly, the directions 385 and 386 are not limited to the directions shown in FIG. 13.

The bottom view of the display 300 in FIG. 13 shows an example of a pinch-and-expand input 390. The pinch-and-expand input 390 can include or occur by placing a first digit at a location 393 on the display 302 and a second digit at a location 394 on the display 302, moving the first and second digits away from one another (e.g., opposite directions 395 and 396), stopping movement of the first and second digits at locations 391 and 392, respectively, and removing the digits away from the touch screen display 302. A pinch-and-expand input can occur within a single VDP window graph, but is not so limited. The location 391, the location 392, the location 393, and the location 394 are not limited to the locations shown in FIG. 13. Accordingly, the directions 395 and 396 are not limited to the directions shown in FIG. 13.

The processor 202 can receive selection inputs, squeeze inputs, and pinch-and-zoom inputs from the display 302 or the user interface 208. The processor can 202 execute program instructions of the CRPI 218 in response to receiving any of those inputs so as to carry out several of the functions described herein.

Figure 14:
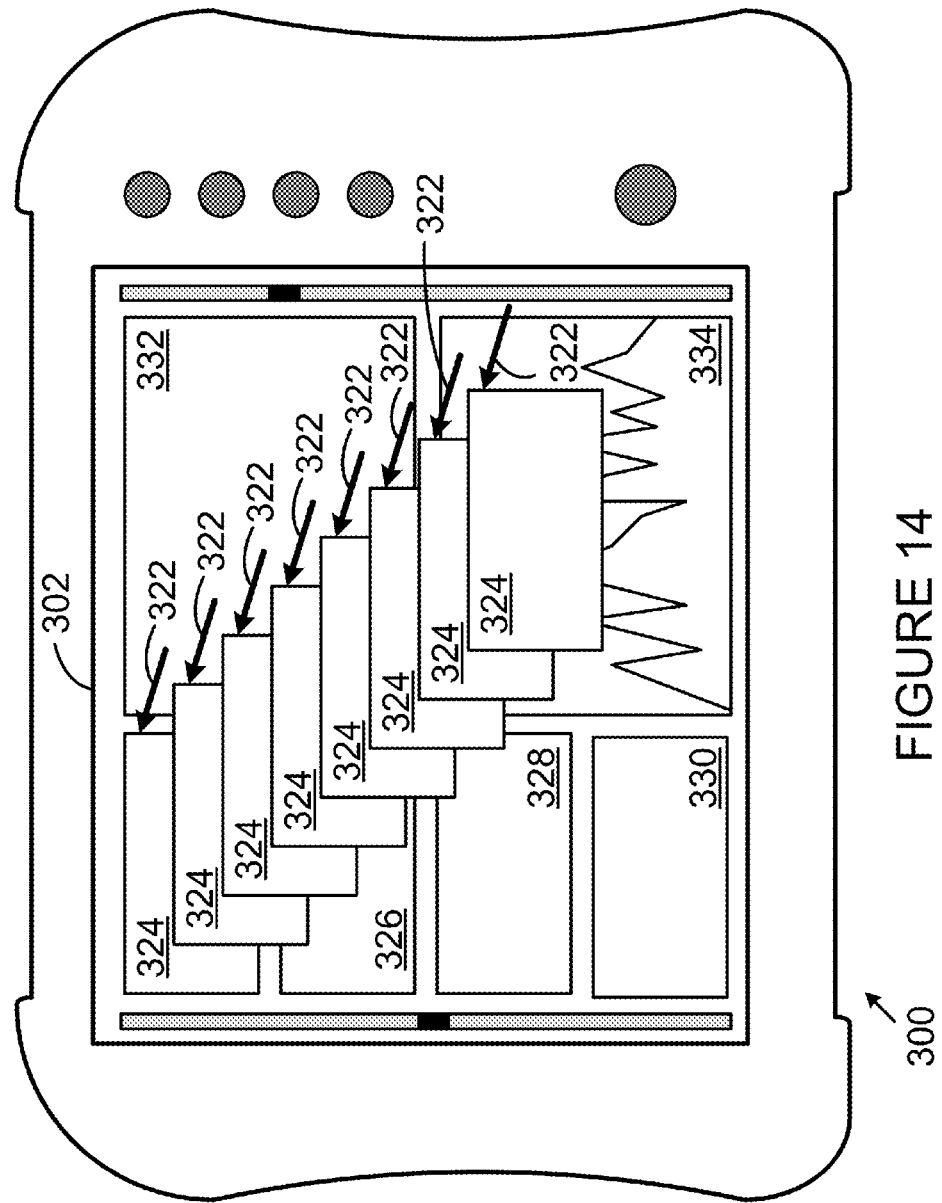
FIG. 14 is a diagram showing another view of the example VST with a display in accordance with the example embodiments.

Next, FIG. 14 is a diagram showing another view of the VST 300 with the display 302 in accordance with the example embodiments. In particular, FIG. 14 depicts performance of a drag-and-drop input through the use of the display pointer 322. A drag-and-drop input can be carried out on any of a variety of elements. FIG. 14 shows the drag-and-drop input carried out on the VDP graph window 324. The display pointer 322 can be used to select the VDP graph window 324. Movement of the display pointer 322 with the VDP graph window 324 can cause movement of the VDP graph 324 to another location on the display 302. The other location can include at least one other VDP graph window.

The processor 202 can use any of a plurality of rules to determine which VDP graph window to drop the dragged VDP graph window onto if the dragged VDP graph window is dragged onto multiple VDP graph windows. A first example rule is to drop the dragged VDP graph window onto the last VDP graph window onto which the VDP graph window was dragged. A second example rule is to drop the dragged VDP graph window onto the VDP graph window which is covered by the largest portion of the dragged VDP graph window. For instance if fifty-one percent of the dragged VDP graph window covers VDP graph window 334, then the dragged VDP graph window is dropped onto the VDP graph window 334.

The processor 202 can receive drag-and-drop inputs from the display 302 or the user interface 208. The processor can 202 execute program instructions of the CRPI 218 in response to receiving a drag-and-drop input. A drag-and-drop input can occur using a selection input of a touch screen display.

Figure 21:
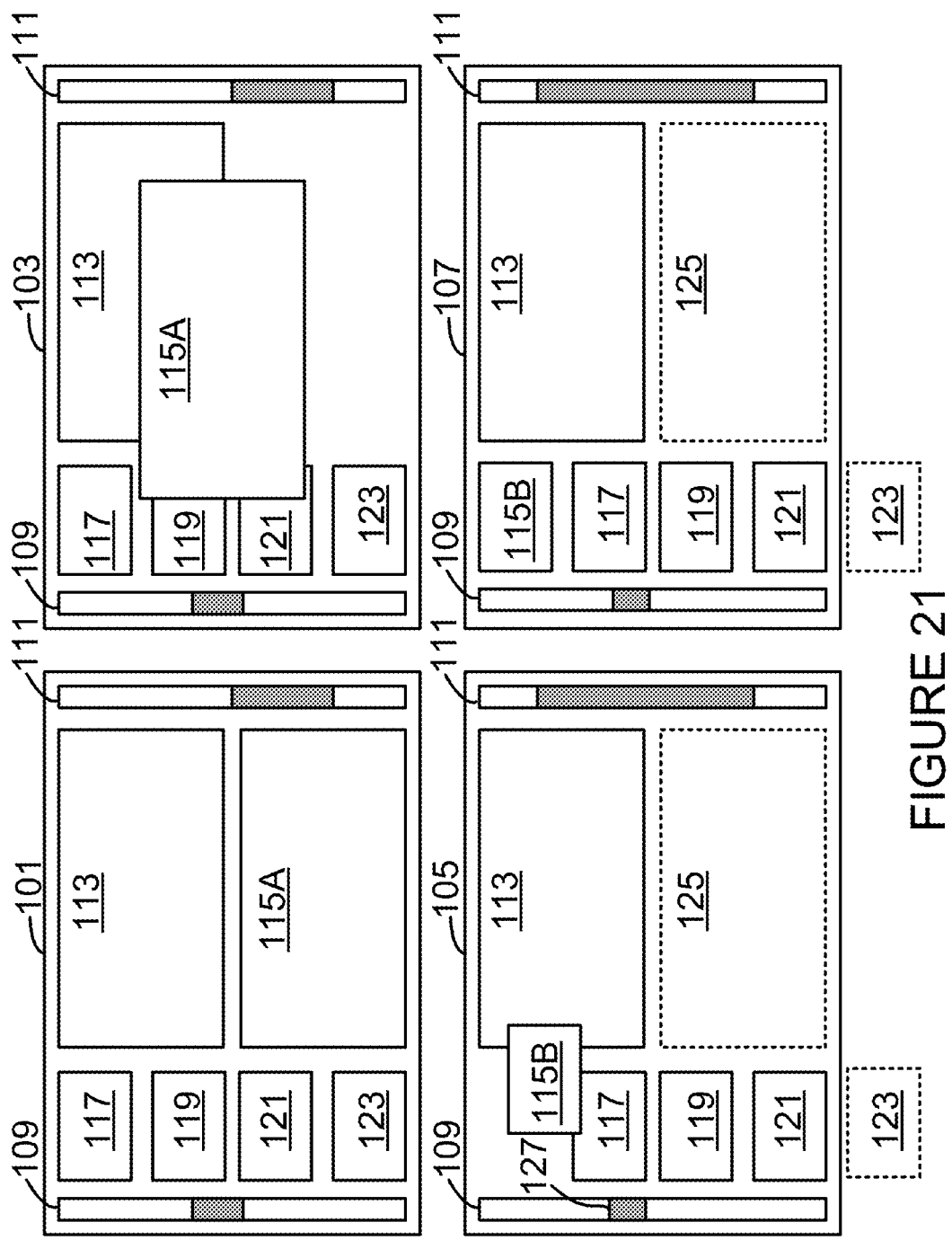

Next, FIG. 21 depicts performance of another drag-and-drop input that can be performed by the VST 200 or 300. FIG. 21 shows display presentations 101, 103, 105, and 107 that can be provided by a display such as the display 302 prior to, during, or after the drag-and-drop input. For the drag-and-drop input shown in FIG. 21, the display 302 is positioned in the landscape orientation, but the drag-and-drop input can also be performed in a similar manner when the display 302 is positioned in the portrait orientation.

Prior to the drag-and-drop input, the DP 101 displayed by the display 302 includes large VDP graph windows 113, 115A, small VDP graph windows 117, 119, 121, and 123, and a small VDP graph window scroll bar 109, and a large VDP graph window scroll bar 111. The scroll bar 109 can be used to scroll through a set of small VDP graph windows (some of which are not displayed in DP 101 and 103). The scroll bar 111 can be used to scroll through a set of large VDP graph windows (none of which are shown in FIG. 21).

A drag-and-drop input can be initiated by a long press of a VDP graph-window. As an example, the long press can be performed by touching the touch screen of the display 302 with a finger positioned on the VDP graph window to be selected, the display pointer 322, an input key of the input section 304, or in another manner. The long press can allow the selected VDP graph-window to be repositioned with the display 302. DP 103 shows that VDP graph window 115A was selected for the drag-and-drop input and subsequently moved upward and to the left from a prior position of the large VDP graph window 115A.

Prior to completion of the drag-and-drop input, a size of the selected VDP graph window can change (in other words, the VDP graph window can be resized). DP 105 illustrates that the large VDP graph window 115A has decreased to the small VDP graph window 115B. The content of graphs within VDP graph windows 115A and 115B can be the same, but is not required to be the same. For instance, the amount of time represented by a graph in a small VDP graph window can be less than the amount of time represented by a graph in a large VDP graph window. The PID pertaining to the graphs of VDP graph windows 115A and 115B are preferably the same, but are not required to be.

As an example, the size of the large VDP graph window 115A can change after the large VDP graph window 115A enters into an area covered by another VDP graph window or covers a predetermined portion of another VDP graph window. As the size of the large VDP graph window 115A changes to the small VDP graph window 115B, one or more displayed VDP graph windows of the resized VDP graph window can be repositioned. Repositioning of one those VDP graph windows can include removing that VDP graph window from the display 302. DP 105 and 107 show small VDP graph windows 117, 119, and 121 have moved downwards and small VDP graph window has been repositioned by removing small VDP graph window 123 from the display. A selector 127 of the scroll bar 109 can be moved to move the small VDP graph windows such that the small VDP graph window 123 can be displayed again by the display 302 (i.e., changed from a virtual graph window to a displayed graph window) or moved further away from being displayed again by the display 302.

As another example, the selected VDP graph window can be a small VDP graph window that is resized to be a large VDP graph window and repositioned in a display position designated for large VDP graph windows. In accordance with this example, another large VDP graph window can be repositioned upward or downward from the VDP graph windows being displayed by the display 302.

FIG. 21 shows a large VDP graph window position 125 at which the large VDP graph window 115A was displayed prior to the drag-and-drop input. A window graph position, such as the large VDP graph window position 125, can remain empty of any VDP graph windows after the drag-and-drop input that removed a VDP graph window from that position. In one respect, a user can manually select another PID such that the display 302 displays a VDP graph of that PID at VDP graph window position 125 after the drag-and-drop input. Alternatively, the processor 202 can automatically select a VDP graph of another PID to display at the graph window position 125 after the drag-and-drop input.

III. Example Operation

Figure 5:
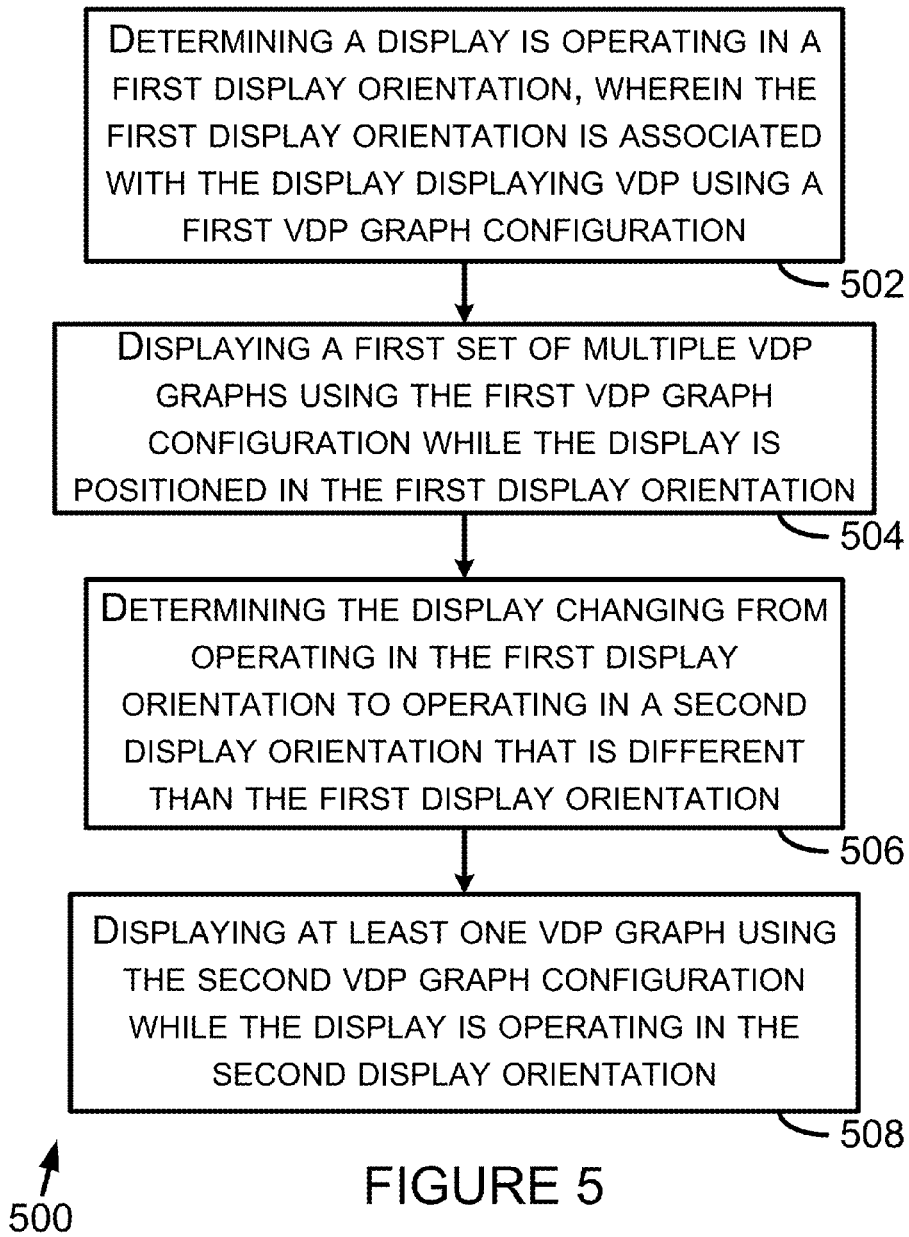
FIG. 5 is a flowchart depicting a set of functions that can be carried out in accordance with one or more example embodiments.

Next, FIG. 5 is a flowchart depicting a set of functions 500 (or more simply "the set 500") that can be carried out in accordance with one or more example embodiments described herein. The set 500 includes the functions shown in blocks labeled with even numbers 502 through 508 inclusive. The following description of the set 500 includes references to elements shown in other figures in this application, but the functions of the set 500 are not limited to be carried out by the referenced elements. A variety of methods can be performed using one or more of the functions shown in the set 500. Any of those methods can be performed with other functions such as one or more of the other functions described herein.

Block 502 includes determining a display 302 is operating in a first display orientation. The processor 202 can execute program instructions of the CRPI 218 to make the determination of block 502 and can execute the same or other program instructions to make the determination of block 506 discussed below or to cause a display, such as the display 302, to perform the displaying functions of blocks 504 and 508 discussed below. The first display orientation is associated with a display displaying VDP graphs using a first VDP graph configuration.

Each of blocks 502, 504, 506, and 508 refer to at least one of the first display orientation and the second display orientation. As an example, the first display orientation can include or be a portrait orientation of the display 302 and the second display orientation can include or be a landscape orientation of the display 302. As another example, the first display orientation can include or be a landscape orientation of the display 302 and the second display orientation can include or be a portrait orientation of the display 302.

Figure 11:
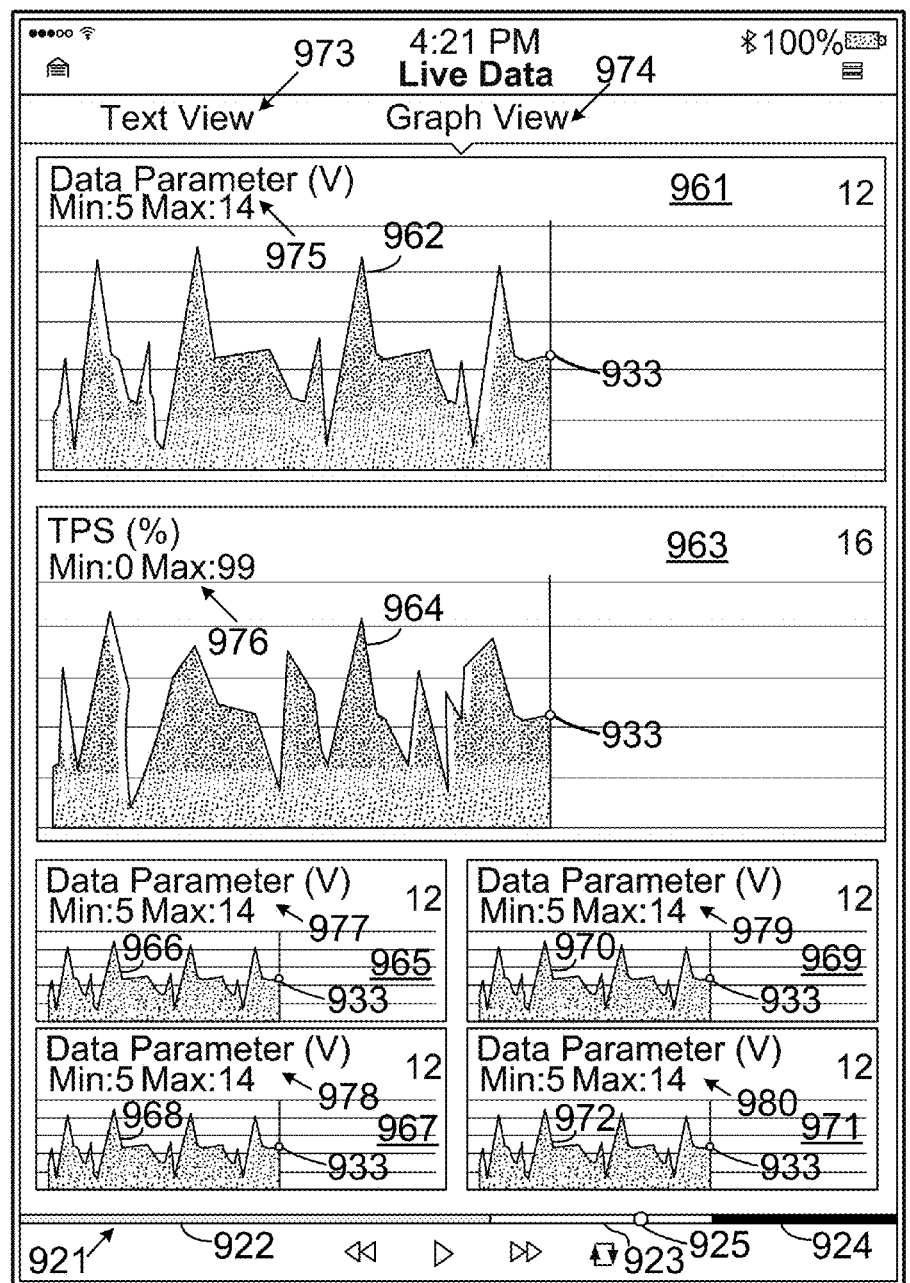
FIG. 11 is a diagram depicting another example display presentation by a VST display.
Figure 12:
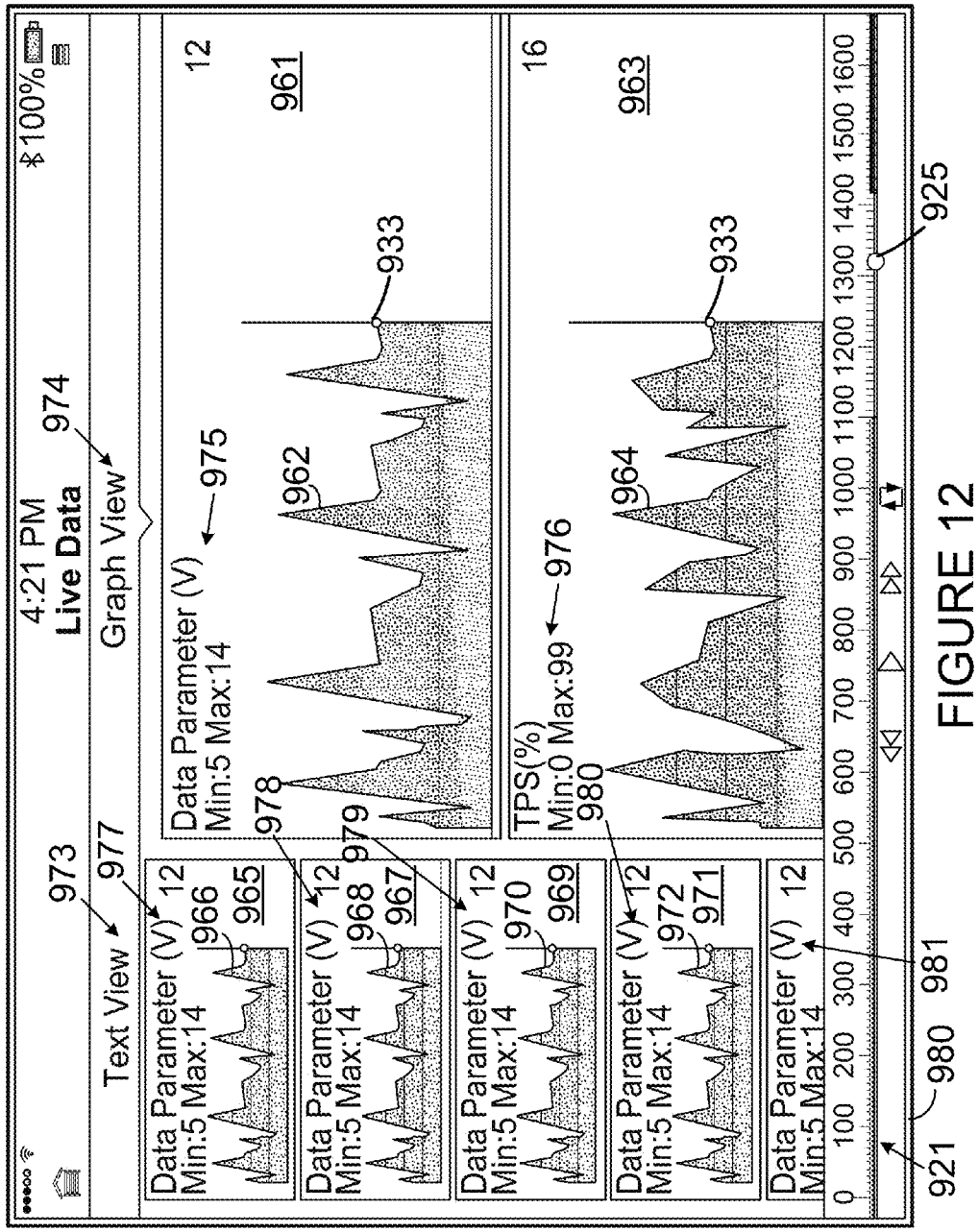
FIG. 12 is a diagram depicting another example display presentation by a VST display.

Next, block 504 includes displaying a first set of multiple VDP graphs using the first VDP graph configuration while the display 302 is positioned in the first display orientation. The display 302 or a display of the user interface 208 can perform the displaying of block 504 and the displaying of block 508 discussed below. FIG. 11 and FIG. 12 show examples of sets of multiple VDP graphs. The first set of multiple VDP graphs can be configured like one of those example sets of multiple VDP graphs, but is no so limited.

Next, block 506 includes determining the display changing from operating in the first display orientation to operating in a second display orientation that is different than the first display orientation. The processor 202 may determine the display orientation change by receiving one or more signals from the orientation detector 212. The one or more signals can include a message that indicates the display 302 is operating in the second display orientation. In that way, the orientation detector 212 determines the display orientation change and notifies the processor 202 of the display orientation change. The second display orientation can be associated with the display 302 displaying at least one VDP graph using a second VDP graph configuration that is different than how the at least one VDP graph was displayed using the first VDP graph configuration.

As an example, determining the display 302 changing orientation from the first display orientation to the second display orientation can include determining a yaw movement of the VST 200 from such time that the top and the bottom of the display 302 were in a horizontal position or a vertical position. A number of degrees of the yaw movement could be a number of degrees within a range of degrees such as, but not limited to, 40 degrees to 50 degrees, 40 degrees to 90 degrees, 40 degrees to 140 degrees, or 40 degrees to 130 degrees.

The processor 202 or the display 302 can perform or cause various functions to be performed in response to the determination of block 506. For example, in response to determining the display 302 changing from operating in the first display orientation to the second display orientation, the display 302 can change from displaying a first VDP graph using a first large VDP graph window of the at least one large VDP graph window of the first VDP graph configuration to displaying the first VDP graph using a first small VDP graph window of the at least two small VDP graph windows of the second VDP graph configuration, and the display 302 can change from displaying a second VDP graph using a first small VDP graph window of the at least two small VDP graph windows of the first VDP graph configuration to displaying the second VDP graph using a first large VDP graph window of the at least one large VDP graph windows of the second VDP graph configuration. As another example, the display 302 can change to displaying VDP graph windows for either of the first or second display orientation in accordance with any of the display presentations described herein in response to the determination of block 506.

Next, block 508 includes displaying at least one VDP graph using the second VDP graph configuration while the display is operating in the second display orientation. In one respect, displaying the at least one VDP graph using the second VDP graph configuration can include displaying a second set of multiple VDP graphs. In another respect, displaying the at least one VDP graph using the second VDP graph configuration while the display 302 is operating in the second display orientation can include displaying a single VDP graph covering an area of the display covered by the first set of multiple VDP graphs using the first VDP graph configuration while the display 302 is positioned in the first display orientation. Each of the multiple VDP graphs can be located within a separate and respective VDP graph window such that displaying the at least one graph using the second VDP graph configuration includes displaying multiple VDP graph windows. The second set of multiple VDP graphs can be configured like one of the example sets of multiple VDP graphs shown in FIG. 11 and FIG. 12, but is no so limited.

Various examples pertain to the vehicle data parameters discussed in the set 500. For example, the vehicle data parameters represented by the first set of multiple VDP graphs can be identical to vehicle data parameters represented by the second set of multiple VDP graphs. As another example, at least one vehicle data parameter represented by the first set of multiple VDP graphs is not among the vehicle data parameters represented by the second set of multiple VDP graphs. As another example, each VDP graph of the first set of multiple VDP graphs is associated with a different PID with respect to the PID associated with the other VDP graphs of the first set of multiple VDP graphs.

Various examples pertain to the graph configurations discussed in the set 500. For example, the first VDP graph configuration can include at least one large VDP graph window and at least two small VDP graph windows. As another example, the first VDP graph configuration can include the at least one large VDP graph window of the first VDP graph configuration positioned on left sides or right sides of the at least two small VDP graph windows of the first VDP graph configuration. As another example, the second VDP graph configuration can include at least one large VDP graph window and at least two small VDP graph windows. As another example, the second VDP graph configuration can include the at least one large VDP graph window of the second VDP graph configuration positioned above or below the at least two small VDP graph windows of the second VDP graph configuration.

Additional functions that can be performed alone or with one or more other functions of a set of functions described herein are now described. The description of these additional functions includes references to elements shown in the figures, but the additional functions are not limited to be carried out by the referenced elements. Some of these additional functions include multiple additional functions.

An additional function includes receiving, by the processor 202, an input to scroll (i.e., a scroll input) a portion of the display 302 at which at least two small VDP graph windows of a VDP graph configuration are displayed, and scrolling, by the display 302 in response to the processor 202 receiving the input to scroll, the portion of the display at which the at least two small VDP graph windows of the VDP graph configuration are displayed. As an example, the input to scroll could be input by or to the scroll bar 338. As another example, the at least two small VDP graph windows could include VDP graph windows 324, 326, 328, and 330, but are not so limited.

In accordance with the foregoing additional function, scrolling the portion of the display 302 at which the at least two small VDP graph windows of the VDP graph configuration are displayed can include displaying at least one small VDP graph not displayed in any of the at least two small VDP graph windows of the first VDP graph configuration at a time the scrolling is initiated and removing at least one small VDP graph displayed in one of the at least two small VDP graph windows of the VDP graph configuration at the time the scrolling is initiated. A VDP graph that is not displayed, but that can be displayed in response to a scroll input, can be referred to as a virtual VDP graph or a VDP graph at a virtual display position.

Another additional function includes receiving, by the processor 202, an input to scroll a portion of the display 302 at which at least one large VDP graph window of a VDP graph configuration is displayed, and scrolling, by the display 302 in response to the processor 202 receiving the input to scroll, the portion of the display at which the at least one large VDP graph window of the VDP graph configuration is displayed. As an example, the input to scroll could be input by or to the scroll bar 336. As another example, the at least one large VDP graph window could include one of VDP graph windows 332 and 334, but is not so limited.

In accordance with the foregoing function, scrolling the portion of the display 302 at which the at least one large VDP graph window of the VDP graph configuration is displayed can include displaying at least one large VDP graph not displayed in any of the at least one large VDP graph window of the first VDP graph configuration at a time the scrolling is initiated and removing at least one large VDP graph displayed in one of the at least one large VDP graph window of the VDP graph configuration at the time the scrolling is initiated. In other words, a large VDP graph window at a virtual display position can be displayed in response to the scroll input and a large VDP graph window at a displayed position can be removed from the display and repositioned at a virtual display position.

Figure 6:
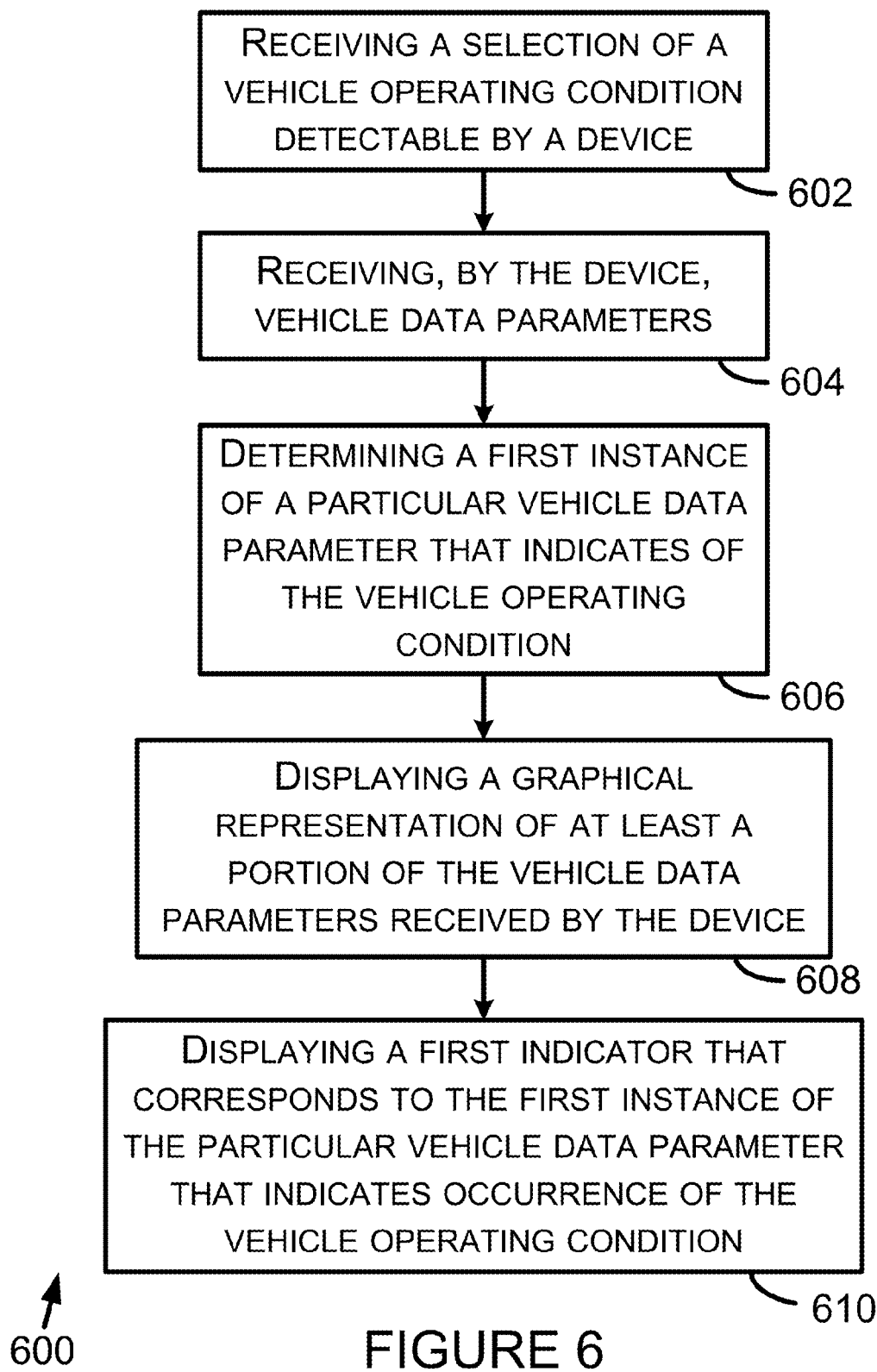
FIG. 6 is a flowchart depicting another set of functions that can be carried out in accordance with one or more example embodiments.

Next, FIG. 6 is a flowchart depicting a set of functions 600 (or more simply "the set 600") that can be carried out in accordance with one or more example embodiments described herein. The set 600 includes the functions shown in blocks labeled with even numbers 602 through 610 inclusive. The following description of the set 600 includes references to elements shown in other figures in this application, but the functions of the set 600 are not limited to be carried out by the referenced elements. A variety of methods can be performed using one or more of the functions shown in the set 600. Any of those methods can be performed with other functions such as one or more of the other functions described herein.

Block 602 includes receiving a selection of a vehicle operating condition detectable by a device. The receiving function of block 602 can be performed by a VST, such as the VST 200, the VST 300 or some other device. In particular, the receiving function of block 602 can be performed by the user interface 208 or the processor 202.

As an example, selecting the vehicle operating condition can include selecting a PID from a displayed list of PID that can be requested from the ECU 106. The processor 202 can refer to the VOC 226 to determine which PID can be requested from the vehicle 102 or the ECU 106. Receiving the VOC can include the processor 202 selecting at least one default threshold (e.g., an upper default threshold or a lower default threshold) associated with the selected PID. Receiving the VOC can include the processor 202 receiving an input from the user interface 208 for user-configuration of a threshold associated with the selected PID.

As another example, selecting the vehicle operating condition can include selecting a DTC from a displayed list of DTC that can be set active by the vehicle 102 or by reading the DTC set active by the ECU 106. The processor 202 can refer to the VOC 226 to determine one or more vehicle PID associated with the selected PID or DTC and responsively request, from the vehicle 102, VDP identified by the determined vehicle PID.

As yet another example, selecting the vehicle operating condition can include selecting a VDP to be measured or otherwise captured by the input section 214. Other examples of receiving the VOC are also possible.

Next, block 604 includes receiving, by the device, vehicle data parameters. As an example, one or more of the VDP can be received by the DLC connector 206 and provided to the processor 202 or to the data storage device 204 for storage within the VDP 224. That one or more VDP can be transmitted by the ECU 106 over the vehicle communication link 110 to the DLC 110 and to the DLC connector 106 over the communication link 112 in response to a request for VDP identified by the vehicle PID determined with respect to block 602. The VDP received at the DLC connector 206 can include the PID associated with the VDP. As another example, one or more of the VDP can be received by the input section 214 and provided to the processor 202 or to the data storage device 204 for storage within the VDP 224.

Next, block 606 includes determining a first instance of a particular vehicle data parameter that indicates the vehicle operating condition. The determining function of block 606 can be performed by a VST, such as the VST 200, the VST 300 or some other device. In particular, the determining function of block 606 can be performed by the processor 202. The processor 202 can determine the first instance of the VDP from among the VDP received at block 604. As an example, determining the first instance of the particular VDP or any other VDP that indicates the VOC can include the processor 202 determining that the VDP has breached a threshold associated with the VDP. For instance, the processor 202 can determine that the VDP has a parameter that is greater than an upper threshold, is less than a lower threshold, is a value between the upper threshold and the lower threshold after one or more instances of prior VDP values having been greater than the upper threshold or lower than the lower threshold.

Next, block 608 includes displaying a graphical representation of at least a portion of the vehicle data parameters received by the device. The display 302 can display the graphical representation. The graphical representation can include a VDP graph within a VDP graph window such as, but not limited to, any of the VDP graph windows described herein. The graphical representation can be displayed in response to selecting a graph view option from the display 302.

Next, block 610 includes displaying a first indicator that corresponds to the first instance of the particular vehicle data parameter that indicates occurrence of the vehicle operating condition. The display 302 can display the first indicator and one or more other indicators that correspond, respectively, to one or more other instances of the VDP indicating occurrence of the VOC. For example, the display 302 can also display a second indicator that corresponds to a second instance of the particular VDP that indicates occurrence of the VOC. Displaying the second indicator can include displaying the second indicator in proximity to a time-based indicator 921 (shown in FIG. 10 and other figures) to indicate, from among the respective times, a second time that corresponds to the device or VST receiving the second instance of the particular VDP.

Figure 10:
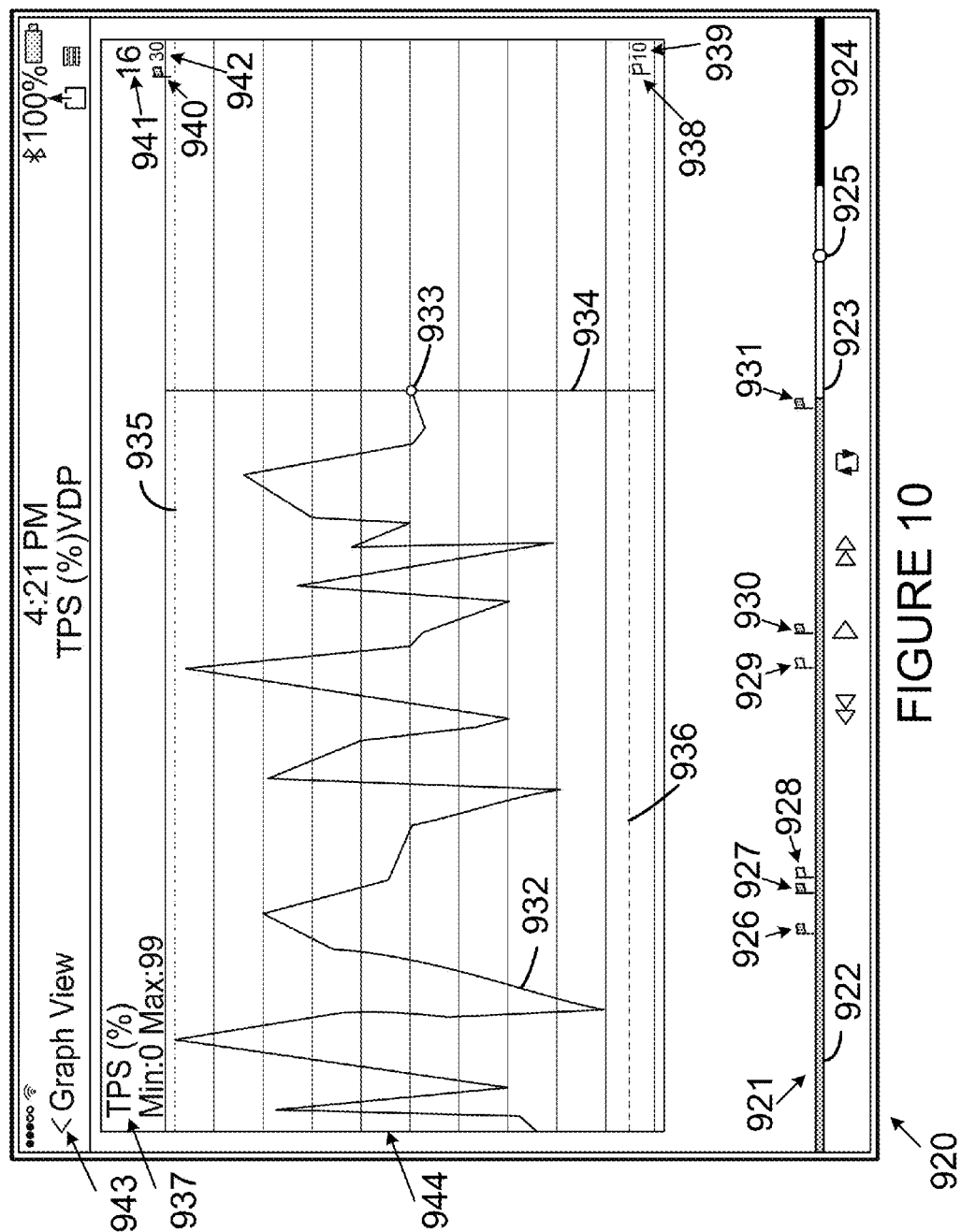
FIG. 10 is a diagram depicting an example display presentation by a VST display.

Another additional function includes displaying, by a device (e.g., the VST 200 or 300), the time-based indicator 921 corresponding to respective times when the device received the vehicle data parameters. As shown in FIG. 10, a display, such as the display 302, can display the time-based indicator 921. Displaying the first indicator, discussed with respect to block 610, can include displaying the VOC indicator (e.g., any of VOC indicators 926, 927, 928, 929, 930, and 931 shown in FIG. 10) in proximity to the time-based indicator 921 to indicate, from among the respective times, a time that corresponds to the device receiving the first instance of the particular vehicle data parameter and with respect to a current time at which the device 300 is receiving VDP.

Another additional function includes receiving, by the device (e.g., the VST 200 or 300), a selection of the first indicator (e.g., a first VOC indicator), and displaying by the device (e.g., by the display 302) in response to receiving the selection of the first indicator, a graphical representation of at least a portion of the received VDP including the first instance of the VDP referred to in block 610.

Another additional function includes displaying, by the device or the VST 200 or 300, a representation of the first indicator in proximity to the at least one of an upper threshold indicator 935 and the lower threshold indicator 936. Example indicator representations 938 and 940 are shown in FIG. 10.

Figure 7:
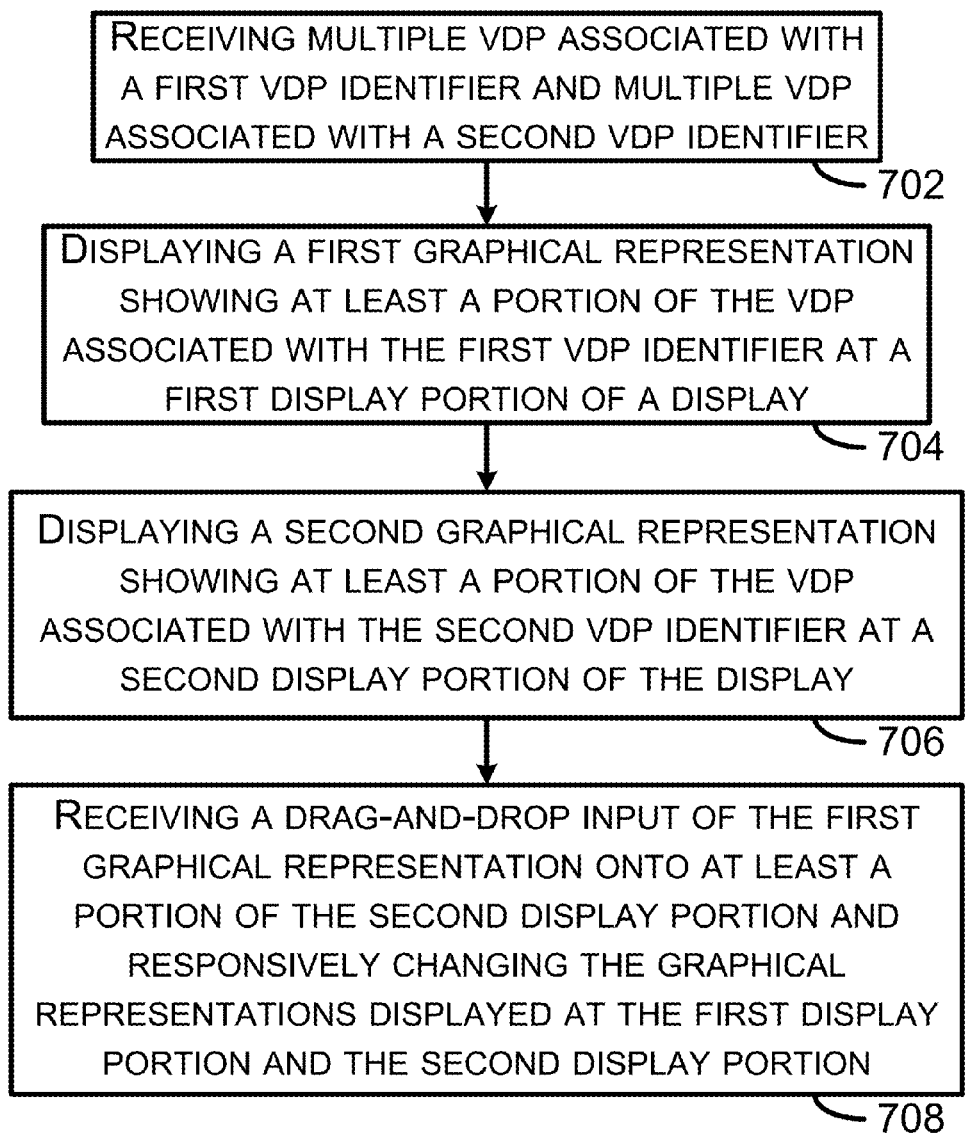
FIG. 7 is a flowchart depicting another set of functions that can be carried out in accordance with one or more example embodiments.

Next, FIG. 7 is a flowchart depicting a set of functions 700 (or more simply "the set 700") that can be carried out in accordance with one or more example embodiments described herein. The set 700 includes the functions shown in blocks labeled with even numbers 702 through 708 inclusive. The following description of the set 700 includes references to elements shown in other figures in this application, but the functions of the set 700 are not limited to be carried out by the referenced elements. A variety of methods can be performed using one or more of the functions shown in the set 700. Any of those methods can be performed with other functions such as one or more of the other functions described herein.

Block 702 includes receiving multiple VDP associated with a first VDP identifier and multiple VDP associated with a second VDP identifier. Receiving the multiple VDP can be carried out by one or more of the processor 202, the DLC connector 206, and the input section 214.

Next, block 704 includes displaying a first graphical representation showing at least a portion of the VDP associated with the first VDP identifier at a first display portion of a display 302. As an example, the first graphical representation is configurable as a dynamic graphical configuration in which the first graphical representation changes which portion of the multiple vehicle data parameters associated with the first VDP are displayed. In one respect, the first graphical representation can be configured as the dynamic graphical representation while the device is receiving the drag-and-drop input. In another respect, the first graphical representation can be configurable as a static graphical configuration in which the portion of the multiple vehicle data parameters displayed by the first graphical representation does not change.

Next, block 706 includes displaying a second graphical representation showing at least a portion of the VDP associated with the second VDP identifier at a second display portion of the display 302. In one respect, a portion of one of the first display position and the second display position overlaps a portion of the other. In another respect, no portions of the first display position and the second display position overlap the other. An area of the first display position can equal an area of the second display position, and the first and second display positions can have an identical shape. Alternatively, the areas of the first and second display positions can be different or the first and second positions can have different shapes.

Next, block 708 includes receiving a drag-and-drop input of the first graphical representation onto at least a portion of the second display portion and responsively changing the graphical representations displayed at the first display portion and the second display portion. An example of the drag-and-drop input is shown in and described with respect to FIG. 14 and FIG. 21.

As an example, changing the graphical representations can include switching the first display position to display the second graphical representation instead of the first graphical representation.

As another example, changing the graphical representations can include decreasing a size of the first graphical representation to fit the first graphical representation within the second display position and increasing a size of the second graphical representation to fill the first display position with the second graphical representation. This change can occur in accordance with an example in which an area of the first display position is greater than an area of the second display position.

As another example, changing the graphical representations can include decreasing a size of the second graphical representation to fit the second graphical representation within the first display position and increasing a size of the first graphical representation to fill the second display position with the first graphical representation. This change can occur in accordance with an example in which an area of the second display position is greater than an area of the first display position.

Another additional function includes storing, by the data storage device 204, multiple VDP display groups, wherein each VDP display group indicates a VDP identifier associated with vehicle data parameters to be displayed at a corresponding display position of the display 302 when VDP including another VDP identifier are displayed at a particular display position of the display 302.

Another additional function includes determining, by the processor 202 referring to one of the VDP display groups, a VDP identifier associated with VDP to be displayed at the first display position when vehicle data parameters including the first VDP identifier are displayed at the second display position. The VDP identifier associated with VDP to be displayed at the first display position when vehicle data parameters including the first VDP identifier are displayed at the second display position includes the second VDP identifier or a third VDP identifier.

Another additional function includes receiving, by the VST 200 or an element thereof, multiple vehicle data parameters associated with a third VDP identifier. Changing the graphical representations displayed at the first display position and the second display position can include switching the first display position to display a third graphical representation showing at least a portion of the vehicle data parameters associated with the third VDP identifier instead of the first graphical representation. The vehicle data parameters associated with the third VDP identifier may not displayed while the VST 200 or an element thereof is receiving the drag-and-drop input.

Figure 8:
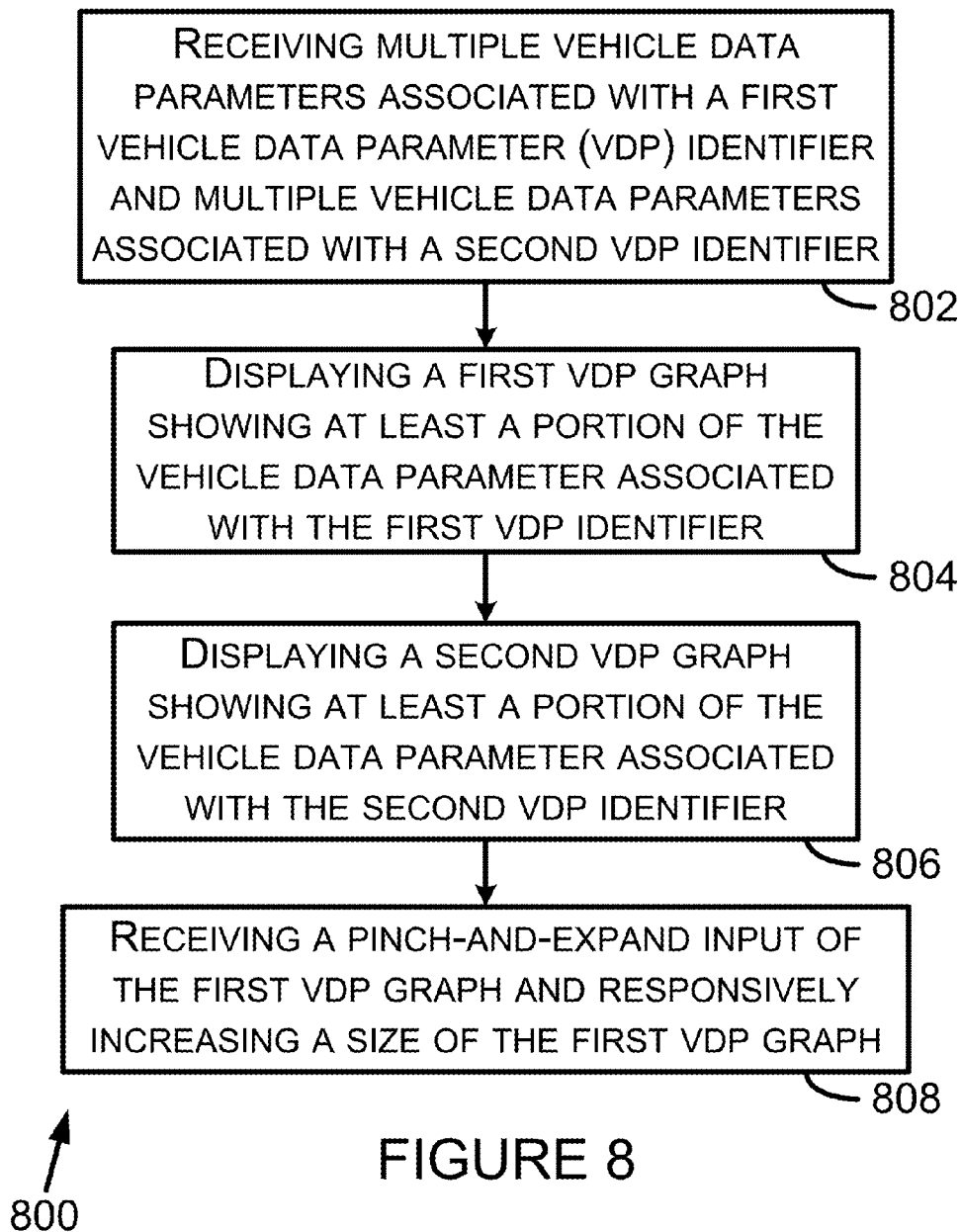
FIG. 8 is a flowchart depicting another set of functions that can be carried out in accordance with one or more example embodiments.

Next, FIG. 8 is a flowchart depicting a set of functions 800 (or more simply "the set 800") that can be carried out in accordance with one or more example embodiments described herein. The set 800 includes the functions shown in blocks labeled with even numbers 802 through 808 inclusive. The following description of the set 800 includes references to elements shown in other figures in this application, but the functions of the set 800 are not limited to be carried out by the referenced elements. A variety of methods can be performed using one or more of the functions shown in the set 800. Any of those methods can be performed with other functions such as one or more of the other functions described herein.

Block 802 includes receiving multiple vehicle data parameters associated with a first VDP identifier and multiple vehicle data parameters associated with a second VDP identifier. The VDP received at block 802 can be received by the VST 200 or the VST 300. In particular, the VDP received at block 802 can be received by the DLC connector 206 or the input section 214. The VDP received at block 802 can be stored in the VDP 224. One or more of the first and second VDP identifiers can include a PID from a vehicle data message. As an example the first VDP identifier can include a PID for parameters that indicate an engine RPM and the second VDP identifier can include a PID for parameters that indicate an engine oil pressure measurement. Other examples of the first and second VDP identifiers are also possible.

Next, block 804 includes displaying a first VDP graph showing at least a portion of the vehicle data parameter associated with the first VDP identifier. Displaying the first VDP graph can include displaying a VDP graph window and any of the content shown or described herein as being displayed within or as part of a VDP graph window. The first VDP graph can include a line graph. An area under a line graph can be shaded or non-shaded. Displaying the first VDP graph can include displaying the VDP graph as part of any display presentation described herein in which at least two VDP graphs are displayed.

Next, block 806 includes displaying a second VDP graph showing at least a portion of the vehicle data parameter associated with the second VDP identifier. Displaying the second VDP graph can include displaying a VDP graph window and any of the content shown or described herein as being displayed within or as part of a VDP graph window. The second VDP graph can include a line graph. Displaying the second VDP graph can include displaying the VDP graph as part of any display presentation described herein in which at least two VDP graphs are displayed.

Next, block 808 includes receiving a pinch-and-expand input of the first VDP graph and responsively increasing a size of the first VDP graph. As an example, receiving the pinch-and-expand input can include the processor 202 determining two digits are placed on respective locations within the first VDP graph on the display 302 and moved from those locations to two other locations. As another example, receiving the pinch-and-expand input can include the processor 202 determining a first digit placed on a location within the first VDP graph on the display 302 and a second digit placed on any other location on the display 302 and the two digits moved from those locations to two other locations. Another example of a pinch-and-expand input is described with respect to the bottom view of FIG. 13.

The processor 202 and the display 302 can perform various actions as part of increasing the size of the first VDP graph. Examples of these various actions are now described. For instance, increasing the size of the first VDP graph can include displaying a same quantity of VDP as the quantity of VDP displayed by the first VDP graph prior to receipt of the pinch-and-expand input.

As another example, increasing the size of the first VDP graph can include repositioning the first VDP graph in response to receipt of the pinch-and-expand input. For instance, the first VDP graph (prior to receipt of the pinch-and-expand input) can include a line graph within a small VDP graph window amongst a plurality of small VDP graph windows displayed on a left side of the display 302. Repositioning the first VDP graph can include positioning the first VDP graph on a right side of the display as a VDP graph in a large VDP graph window. Repositioning the first VDP graph in this manner can include repositioning and resizing a VDP graph within in another large VDP graph window to a position at which the first VDP graph was displayed within a small VDP graph window and as a small VDP graph window.

As another example, increasing the size of the first VDP graph can include using an entire display area of the display 302 to display the first VDP graph. Displaying the first VDP graph can include displaying a VDP graph window within which the VDP graph is included. FIG. 10 illustrates an example of a VDP graph using the entire display area (dedicated for displaying VDP graph windows) of the display 302 to display the VDP line graph 933 and the VDP graph window 944.

As another example, increasing the size of the first VDP graph can include displaying a different quantity of vehicle data parameters associated with the first VDP identifier and using a different time scale to display the different quantity of vehicle data parameters associated with the first VDP identifier. The different quantity can be a quantity less than or greater than the quantity of vehicle data parameters displayed by the first VDP graph prior to receipt of the pinch-and-expand input. The different time scale can be shorter than or longer than a time scale used to display vehicle data parameters of the first VDP graph prior to receipt of the pinch-and-expand input.

As another example, another action performed in response to receipt of the pinch-and-expand input can include changing the second VDP graph. As an example, changing the second VDP graph can include decreasing a size of the second VDP graph. Decreasing the size of the second VDP graph can include removing the second VDP graph from being displayed within the display area of the display (e.g., positioning the second VDP graph at a virtual VDP graph position). In this regard, a third VDP graph can be displayed within a VDP graph window at which the first VDP graph window was displayed prior to and while receiving at least a portion of the pinch-and-expand input.

As another example, changing the second VDP graph can include repositioning the second VDP graph. Repositioning the second VDP graph can include repositioning the second VDP graph to another visible portion of the display 302. Alternatively, repositioning the second VDP graph can include repositioning the second VDP graph to a virtual position of the display 302. A VDP graph positioned in a virtual position of the display can be repositioned within the visible portion of the display 302 by use of a scroll bar or by selecting from a list view of VDP. The display presentations 105 and 107 in FIG. 21 illustrate an example of a VDP graph 123 positioned in a virtual position of the display 302.

Figure 9:
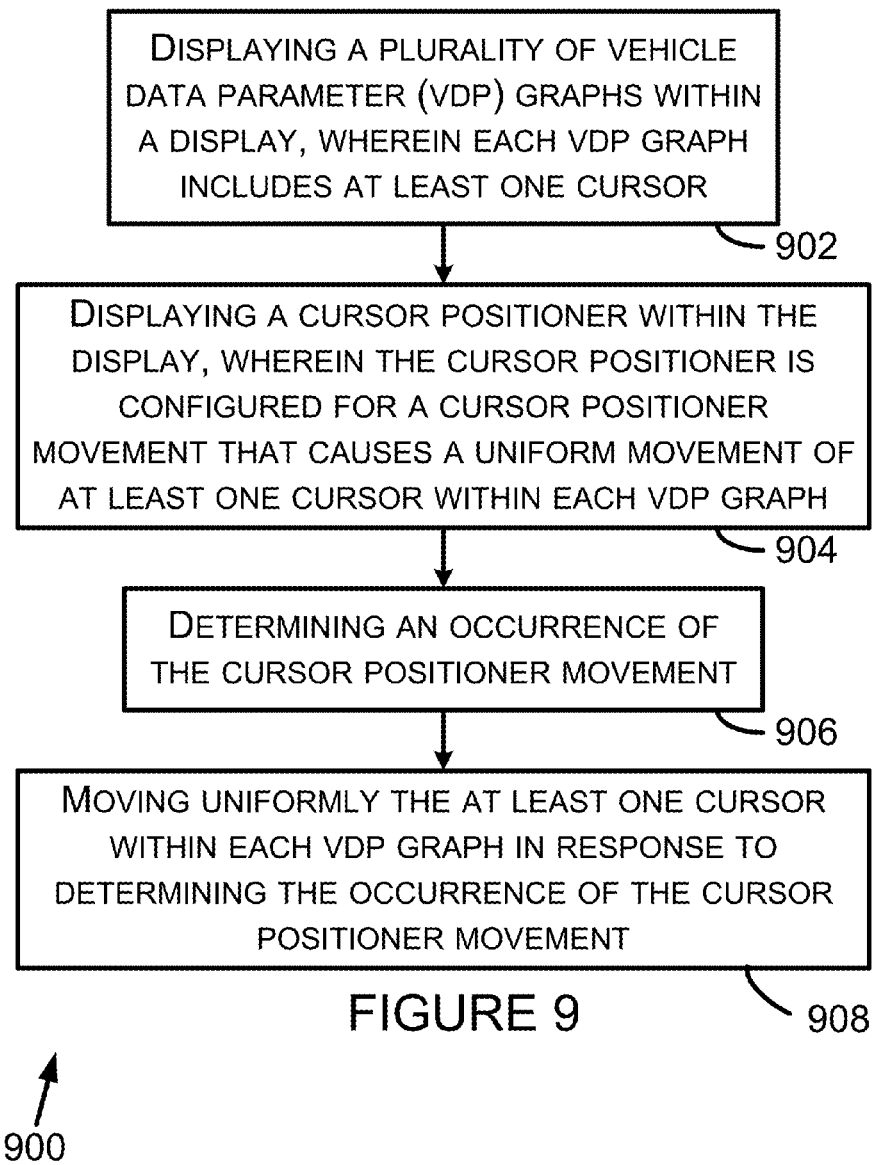
FIG. 9 is a flowchart depicting another set of functions that can be carried out in accordance with one or more example embodiments.

Next, FIG. 9 is a flowchart depicting a set of functions 900 (or more simply "the set 900") that can be carried out in accordance with one or more example embodiments described herein. The set 900 includes the functions shown in blocks labeled with even numbers 902 through 908 inclusive. The following description of the set 900 includes references to elements shown in other figures in this application, but the functions of the set 900 are not limited to be carried out by the referenced elements. A variety of methods can be performed using one or more of the functions shown in the set 900. Any of those methods can be performed with other functions such as one or more of the other functions described in this description.

Block 902 includes displaying a plurality of VDP graphs within a display (e.g., display 302). Each VDP graph can includes at least one cursor 940. FIG. 11 illustrates an example display presentation 450 with multiple VDP graphs windows 961, 963, 965, 967, 969, and 971 displayed by the display 302. Those VDP graph windows show VDP line graphs 962, 964, 966, 968, 970, and 972, respectively.

Next, block 904 includes displaying a cursor positioner within the display 302. The cursor positioner can be configured for a cursor positioner movement that causes a uniform movement of at one cursor 933 within each VDP line graph. A cursor positioner 925 is shown in FIG. 11 and in other figures.

Figure 20:
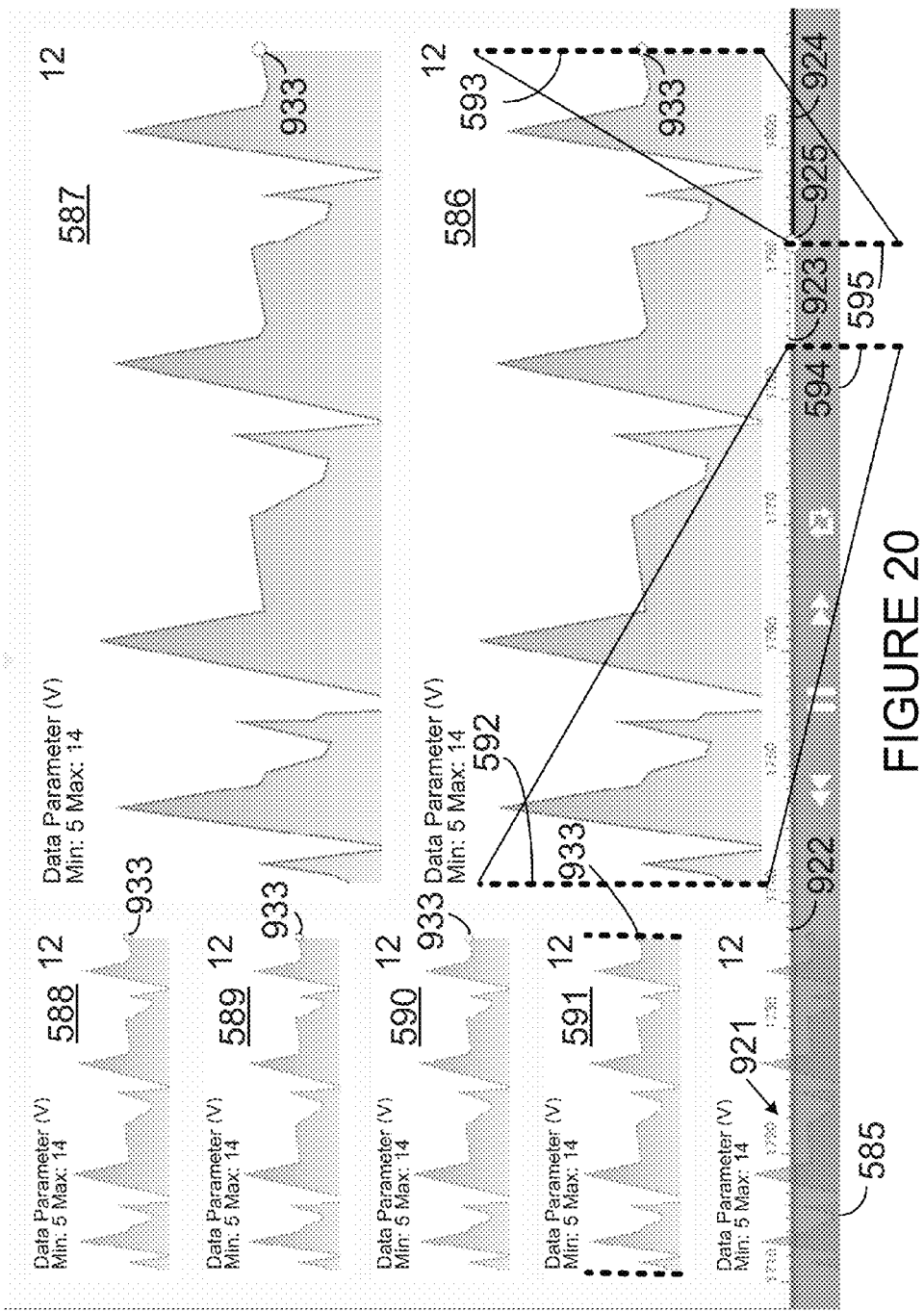

Next, block 906 includes determining an occurrence of the cursor positioner movement. Processor 202 can determine the cursor positioner 925 being moved in a first direction (e.g., to the right when the cursor positioner 925 is positioned as shown in FIG. 11 or FIG. 12) or being moved in a second direction (e.g., to the left when the cursor positioner 925 is positioned as shown in FIG. 11 or FIG. 12). FIG. 20 illustrates the cursor positioner having been moved to the first end 595 of the time segment 923 and each VDP graph window displaying a VDP line graph from side-to-side. Movement of the cursor positioner 925 to the second end of the time segment 923 could cause a cursor of each line graph to be moved to the left side of each VDP graph window shown in FIG. 20.

Next, block 908 includes moving uniformly the at least one cursor within each VDP graph in response to determining the occurrence of the cursor positioner movement. For example, the cursor 933 in each VDP graph window shown in FIG. 20 can be moved uniformly to the left or to the right. The time represented from the left side of each VDP graph window in FIG. 20 to the cursor in each VDP graph window can be an equal amount of time and a common time period. In this way, the display 302 can display VDP graph windows for comparison of the values of VDP that occurred at the same time or in closest proximity in time with respect to other values of the same VDP.

IV. Example Display Presentations

Next, FIG. 10 is a diagram depicting an example display presentation (DP) 920 that can be provided by a display such as the display 302. The DP 920 is arranged in a landscape orientation and includes a VDP graph window 944. The VDP graph window 944 includes a VDP line graph 932, VDP graph text 937, VDP threshold indicators 935, 936, vehicle operating condition indicators 926, 927, 928, 929, 930, and 931, and a time-based indicator 921. The DP 920 includes a view selector 943 for selecting different views for a set of VDP, at least one of which can include a currently displayed VDP. Besides a graph view, other views can include, but are not limited to, a digital view and a list view. The VDP line graph 932 is an example of a line graph in which the area below the line graph is not shaded.

The VDP graph text 937 indicates that the selected VOC thresholds pertain to throttle position sensor (TPS) position and the units are indicated by a percentage. Alternatively, the VDP graph text 937 can include graph text for any other VDP associated with or that can be obtained from the vehicle 102.

The VDP threshold indicator 935 can indicate an upper VDP threshold associated with a TPS position percentage. The VDP threshold indicator 936 can indicate a lower VDP threshold associated with a TPS position percentage. The VDP threshold indicators 935 and 936 can include indicators, such as a horizontal line extending across at least a portion of the VDP graph window 944. The VDP threshold indicators 935 and 936 can include a VOC indicator with a unique characteristic to distinguish them from each other. As shown in FIG. 10, the VOC indicator of the VDP threshold indicator 935 includes a dark-colored flag icon 940, whereas the VOC indicator of the VDP threshold indicator 936 includes a light-colored flag icon 938. The VDP graph window 944 includes an upper threshold indicator 942 that indicates a numeric value of the upper threshold of the VDP displayed in the VDP graph window 944. The VDP graph window 944 includes a lower threshold indicator 939 that indicates a numeric value of the lower threshold of the VDP displayed in the VDP graph window 944.

The time-based indicator 921 can include a cursor positioner 925 and time segments 922, 923, and 924. The cursor positioner 925 can correspond to a cursor 933 in the VDP graph window 944. FIG. 11, FIG. 12, and FIG. 15 to FIG. 20 illustrate other examples of the time-based indicator 921, the cursor positioner 925, and cursors 933. The VDP graph window 944 includes a digital VDP value 941 that indicates a value of the VDP at the cursor 933.

The time segment 922 provides an indication of an amount time or percentage that frames or data values for the displayed VDP were captured prior to the frames or data values of the VDP currently displayed within the VDP graph window 944, relative to the time segments 923 and 924. The time segment 923 provides an indication of an amount of time or percentage represented by the VDP values displayed within the VDP graph window 944, relative to the time segments 922 and 924. The time segment 924 provides an indication of an amount of time or percentage that the VST can receive additional frames or data values of the VDP before prior instances of the received VDP are overwritten or otherwise deleted for storage of additional frame or data values of the VDP, relative to the time segments 922 and 923.

The VDP line graph 932 can be zoomed in or out within the VDP graph window 944. As an example, the cursor positioner 925 can be moved in a first direction (e.g., to the right) in order to zoom in on the VDP line graph 932 and moved in a second direction (e.g., to the left) in order to zoom out on the VDP line graph 932. As another example, the cursor 933 or a cursor bar 934 could be moved in the first and second directions to zoom in and zoom out, respectively, of the VDP line graph 932. As an example, zooming in on a VDP line graph can include decreasing the time represented horizontally within the VDP graph window 944 and zooming out on a VDP line graph can include increasing the time representing horizontally with the VDP graph window 944. Alternatively, repositioning the cursor 933 or the cursor bar 934 can include representing a current value of a VDP at another position within the VDP graph window 944.

Next, FIG. 11 is a diagram depicting an example display presentation 960 that can be provided by a display such as the display 302. The DP 960 is in a portrait orientation. The DP 960 includes VDP graph windows 961, 963, 965, 967, 969, and 971. Those VDP graph windows are an example of a set of multiple VDP graph windows, and include VDP graph text 975, 976, 977, 978, 979, and 980, respectively. Those same VDP graph windows further include VDP graphs 962, 964, 966, 968, 970, and 972, respectively. The VDP graphs of those VDP graph windows are an example of a set of multiple VDP graphs. The VDP graph text 975, 976, 977, 978, 979, and 980 can include text that identifies a different PID for each VDP graph window. The VDP graph text associated with a PID can include a units indicator for the data values of the VDP and at least one of a minimum data value and a maximum data value. The minimum and maximum data values can indicate a low VDP threshold and a high VDP threshold, respectively, but are not so limited. For example the minimum and maximum data values can indicate a minimum data value and a maximum data value of the VDP currently displayed within the VDP graph window including or associated with the VDP graph text.

Figure 16:
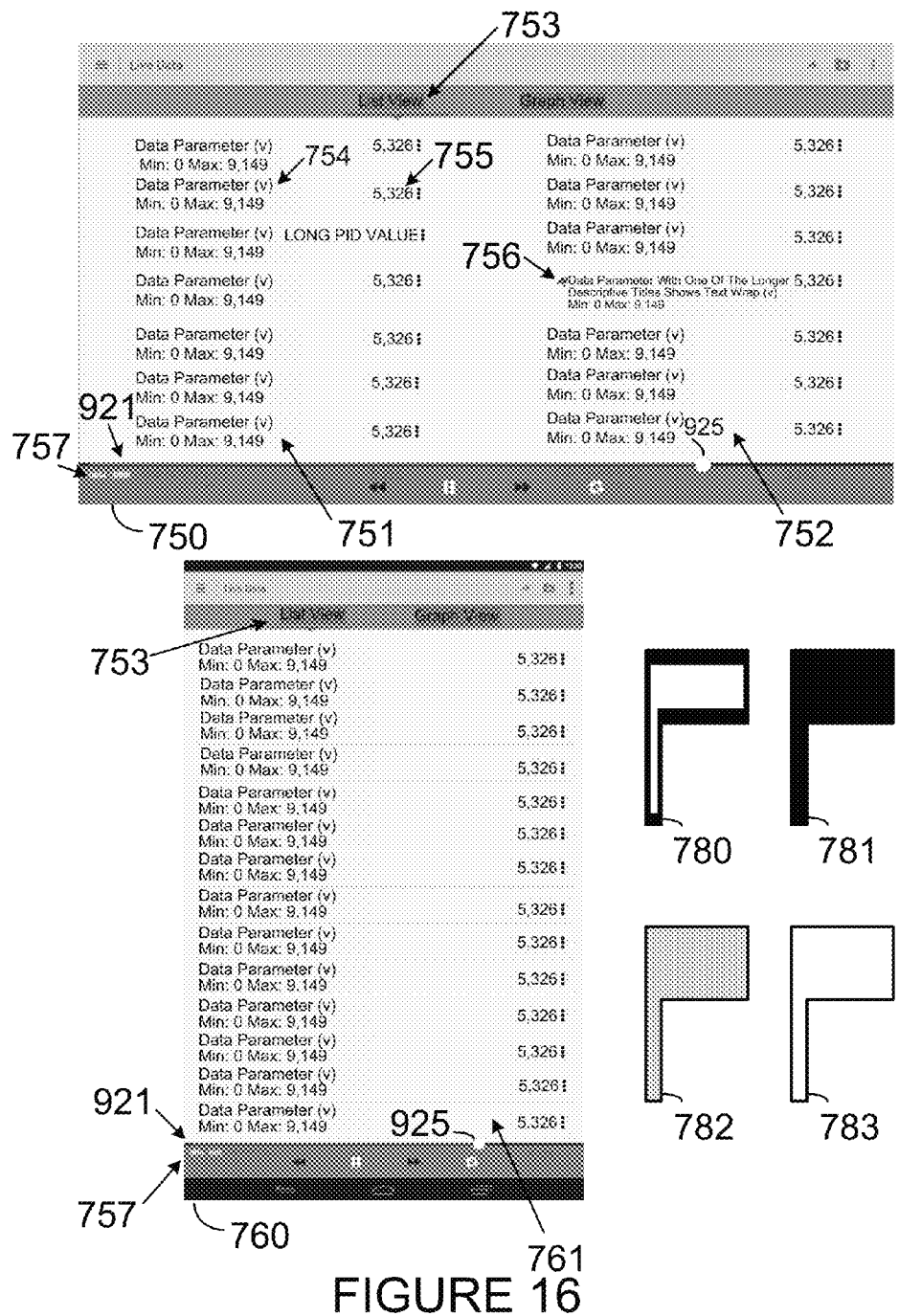

The DP 960 includes a text view selector 973 and a graph view selector 974. While the display 302 is displaying VDP graph windows in a graph view as shown in FIG. 11, the text view selector 973 can be selected by the display pointer 322, or otherwise, to cause the display 302 to begin displaying the VDP shown in one or more of the VDP graph windows 961, 963, 965, 967, 969, and 971, or the data represented therein, in a textual format (e.g., a list view as shown in FIG. 16). While the display 302 is displaying VDP in a textual format, the graph view selector 974 can be selected by the display pointer 322, or otherwise, to cause the display to begin displaying the VDP graph windows 961, 963, 965, 967, 969, and 971.

The DP 960 includes the time-based indicator 921, time segments 922, 923, and 924, cursor positioner 925, and a cursor 933 within each of the VDP graph windows 961, 963, 965, 967, 969, and 971. The cursor positioner 925 can be moved in either direction along the time-based indicator 921 to cause uniform movement of the cursor 933 within each of the VDP graph windows 961, 963, 965, 967, 969, and 971.

Next, FIG. 12 is a diagram depicting an example display presentation 980 that can be provided by a display such as the display 302. The DP 980 is in a landscape orientation. The DP 980 includes VDP graph windows 961, 963, 965, 967, 969, and 971. Those VDP graph windows include VDP graph text 975, 976, 977, 978, 979, and 980, respectively. Those same VDP graph windows further include VDP graphs 962, 964, 966, 968, 970, and 972, respectively. The DP 980 also includes a VDP graph window 981 that is only partially displayed.

The DP 980 includes the text view selector 973 and the graph view selector 974. While the display 302 is displaying VDP graph windows in a graph view as shown in FIG. 12, the text view selector 973 can be selected by the display pointer 322, or otherwise, to cause the display 302 to begin displaying the VDP shown in one or more of the VDP graph windows 961, 963, 965, 967, 969, 971, and 981 in a textual format.

The DP 980 can include one or more scroll bars, such as scroll bars 336 or 338, to allow a user to scroll the DP 980 to bring another VDP graph window that is not currently displayed or that is only partially displayed by the DP 980, such as a VDP graph window 981, completely into the DP 980. As another VDP graph window is brought into the DP 980, a currently displayed VDP graph window can leave the DP 980. The DP 960 shown in FIG. 11 can also include one or more scroll bars to provide a scrolling function similar to the scrolling function available for DP 980. The scroll bars are not shown in FIGS. 11 and 12 for clarity of those figures.

The orientation detector 212 can detect the VST 200 changing from the landscape orientation to the portrait orientation while the display 302 is displaying the DP 980 and responsively cause the display 302 to begin displaying VDP graphs in accordance with the DP 960. Similarly, the orientation detector 212 can detect the VST 200 changing from the portrait orientation to the landscape orientation while the display 302 is displaying the DP 960 and responsively cause the display 302 to begin displaying VDP graphs in accordance with the DP 980.

Figure 15:
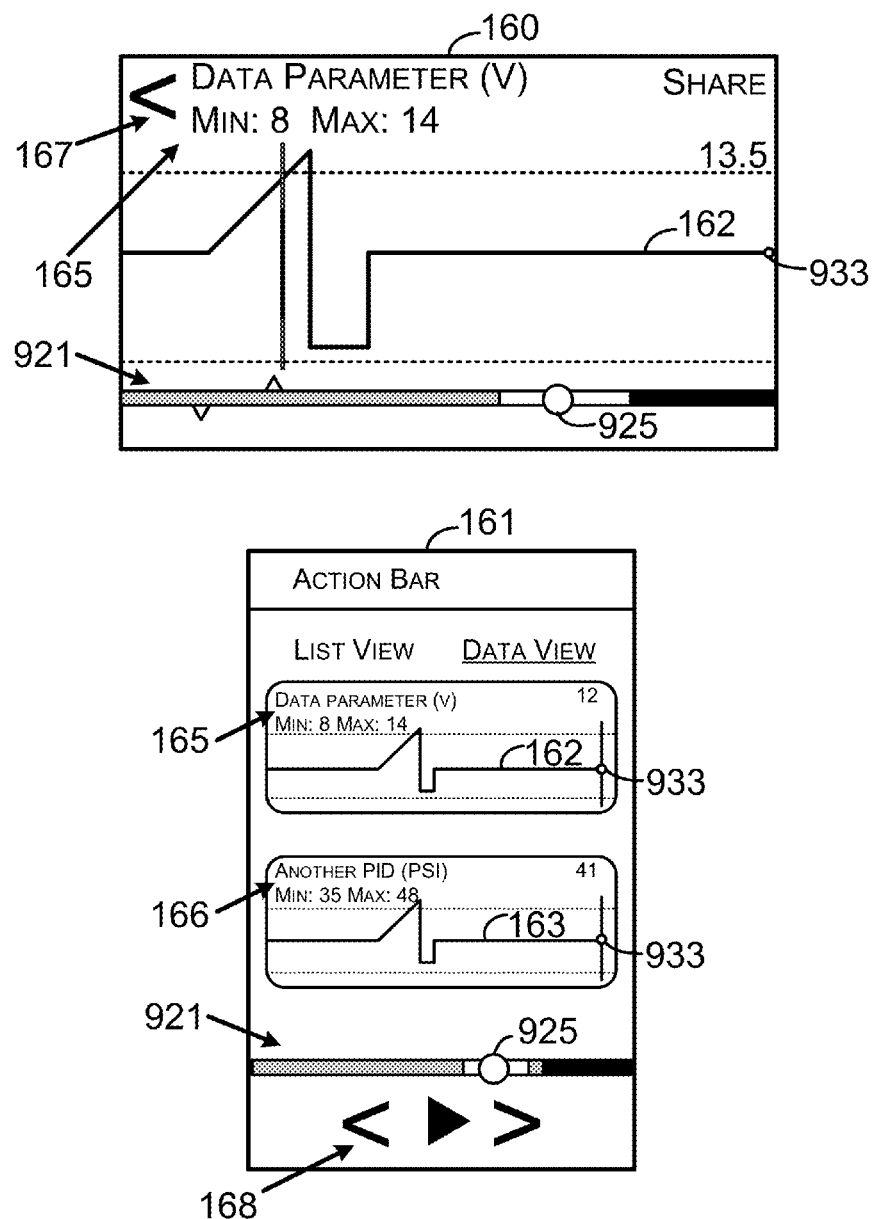
FIG. 15 to FIG. 21 are diagrams depicting additional example display presentations by a VST display.

Next, FIG. 15 is a diagram depicting example display presentations 160 and 161 that can be provided by a display such as the display 302. The display 302 displaying display presentations 160 and 161 can comprise a display within a smartphone, but is not so limited. As an example, the VST 300 can include or be configured as a smartphone. The display 302 is in the landscape orientation for the DP 160 and in the portrait orientation for the DP 161. The DP 160 includes a line graph 162 of data values received for the VDP identified by the VDP graph text 165. The DP 161 includes the line graph 162 of data values received for the VDP identified by the VDP graph text 165 and the line graph 163 of data values received for the VDP identified by the VDP graph text 166.

The orientation detector 212 can detect the VST 300 changing from the landscape orientation while DP 160 is presented by the display 302 to the portrait orientation and responsively cause the display 302 to display the DP 161. The processor 202 can determine one or more VDP graphs to display in the portrait orientation along with the VDP graph 162 displayed in the landscape orientation.

The orientation detector 212 can detect the VST 300 changing from the portrait orientation while the DP 161 is presented by the display 302 to the landscape orientation and responsively cause the display 302 to display the DP 161. The processor 202 can determine that the VDP graph 162 is the only VDP graph to be displayed in response to changing to the landscape orientation.

The DP 160 and the DP 161 each include a time-based indicator 921 and a cursor positioner 925 for selecting the VDP values of the received VDP on which the cursors 933 are positioned. Movement of the cursor positioner 925 for a display presentation with multiple VDP graph cursors 933 and multiple VDP graph windows can cause uniform movement of at least one cursor 933 within each of the multiple VDP graph windows.

The DP 160 includes a VDP selector 167. The DP 161 includes a VDP selector 168. A VDP selector can be used to select a different VDP to display within the display 302.

Next, FIG. 16 is a diagram depicting example display presentations 750 and 760 that can be provided by a display such as the display 302. The display 302 displaying display presentations 750 and 760 can comprise a display within a smartphone, but is not so limited. The display 302 is in the landscape orientation for the DP 750 and in the portrait orientation for the DP 760. The DP 750 includes two columns 751 and 752 of VDP in a list view. The DP 760 includes a single column 761 of VDP in a list view.

The orientation detector 212 can detect the VST 300 changing from the landscape orientation while DP 750 is presented by the display 302 to the portrait orientation and responsively cause the display 302 to display the DP 760. The processor 202 can determine which VDP displayed in the DP 750 are to be displayed in the DP 760 and which VDP will not be displayed in the DP 760.

The orientation detector 212 can detect the VST 300 changing from the portrait orientation while DP 760 is presented by the display 302 to the landscape orientation and responsively cause the display 302 to display the DP 750. The processor 202 can determine which VDP that are not displayed in the DP 760 are to be displayed in the DP 750.

The DP 750 and the DP 760 include DP selectors 753 to select a different VDP display presentation. Either one of the DP 750 and the DP 760 may be entered from another type of view, such as a graph view or a digital view, by selection of the list view from a DP selector 753 in the other type of view. While in the list view of the DP 750 and the DP 760, another type of view can be selected to cause the display to change from the list view to the other type of view.

Each of the DP 750 and the DP 760 include the time-based indicator 921 and a frame or data value indicator 757. As an example, the frame or data value indicator 757 indicates 3,834 of 5,000 frames or data values. In some cases, the VST 300 may have received an identical number of data values for each VDP identified in the list view of VDP. In accordance with those cases, the cursor position 925 can be moved to select a different frame or data value of the 5,000 frames or data values. In other instances, the VST 300 may have received a different number of data values for two or more VDP identified in a list view of VDP. In accordance with these other cases, the cursor positioner 925 can be moved to select a different frame or different value of the received frames or data values for a designated VDP. The data values for the other VDP can change to other data values in relation to the time at which the selected different frame or data value was received.

As shown in FIG. 16, a list view of VDP can include multiple VDP text identifiers (e.g., VDP text identifier 754) and multiple VDP values (e.g., VDP value 755). In column 752, a VOC indicator 756 is displayed for a VDP for which data values of that VDP breeched a VDP threshold (e.g., greater than an upper threshold or lower than a lower threshold). The processor 202 can detect a drag-and-drop input of a VDP displayed in a list view and move the VDP from its initial position when the drag-and-drop input is initiated to a position that includes the location to which the VDP was dragged and dropped by the drag-and-drop input.

The DP 750 and the DP 760 can include at least one scroll bar for entry of a scroll input that causes virtual VDP values not currently displayed by the DP 750 or the DP 760 to be displayed and to cause one or more currently displayed VDP values to be repositioned as a virtual VDP value that is not currently displayed by the DP 750 or the DP 760.

The processor 202 can execute program instructions of the CRPI 216 to provide a VDP threshold selection display by the display 302. The selection display can include selection of a VDP. The selection display can include a selection of at least one VDP threshold associated with the selected VDP or the VDP threshold(s) can be selected by default upon selection of the VDP. The selection display can include a selection of a VOC indicator for a VDP or a VDP threshold or the VOC indicator selection can be selected by default upon selection of the VDP or the VDP threshold.

FIG. 16 shows VOC indicators 780, 781, 782, and 782 as examples of VOC indicators displayable by the display 302. As shown in FIG. 16 and in other figures, each VOC indicator can include a flag and flagpole icon, but the VOC indicators are not so limited. Furthermore, the display 302 can display the VOC indicators with different colors or shading to indicate various characteristics with respect to a VDP threshold or a VOC.

In one respect, the VOC indicator 780 includes an outlined flag (e.g., a white flag outlined in red) and the VOC indicator 781 includes a solid flag (e.g. a red flag). An outlined flag can be displayed to indicate that a VDP threshold is armed, but that the VDP values received for the VDP have not yet breached the VDP threshold. A solid flag can be displayed to indicate that a VDP value received for the VDP has breached an associated VDP threshold that was armed.

Additionally, the display 302 can display text associated with a VDP (e.g., a PID) in proximity to a VOC indicator. The display 302 can display the associated text in various ways to further indicate whether a VDP threshold has been breached. For example, the text associated with the VDP can be blue when a VDP threshold is armed, but not yet breached, and the associated text can be red when the armed VDP threshold has been breached. The processor 202 can cause the associated text to change colors in response to detecting the VDP threshold being breached.

In another respect, the VOC indicator 783 (e.g., a white flag) can indicate that a VDP high threshold has been breached, whereas the VOC indicator 782 (e.g., a gray shaded flag) can indicate that a VDP low threshold has been breached. In yet another respect, if VDP thresholds have been set up and armed for multiple VDP, then a VOC indicator for each VDP can be associated with a respective color or respective shading to distinguish the VOC indicators for each of the multiple VDP.

Figure 17:
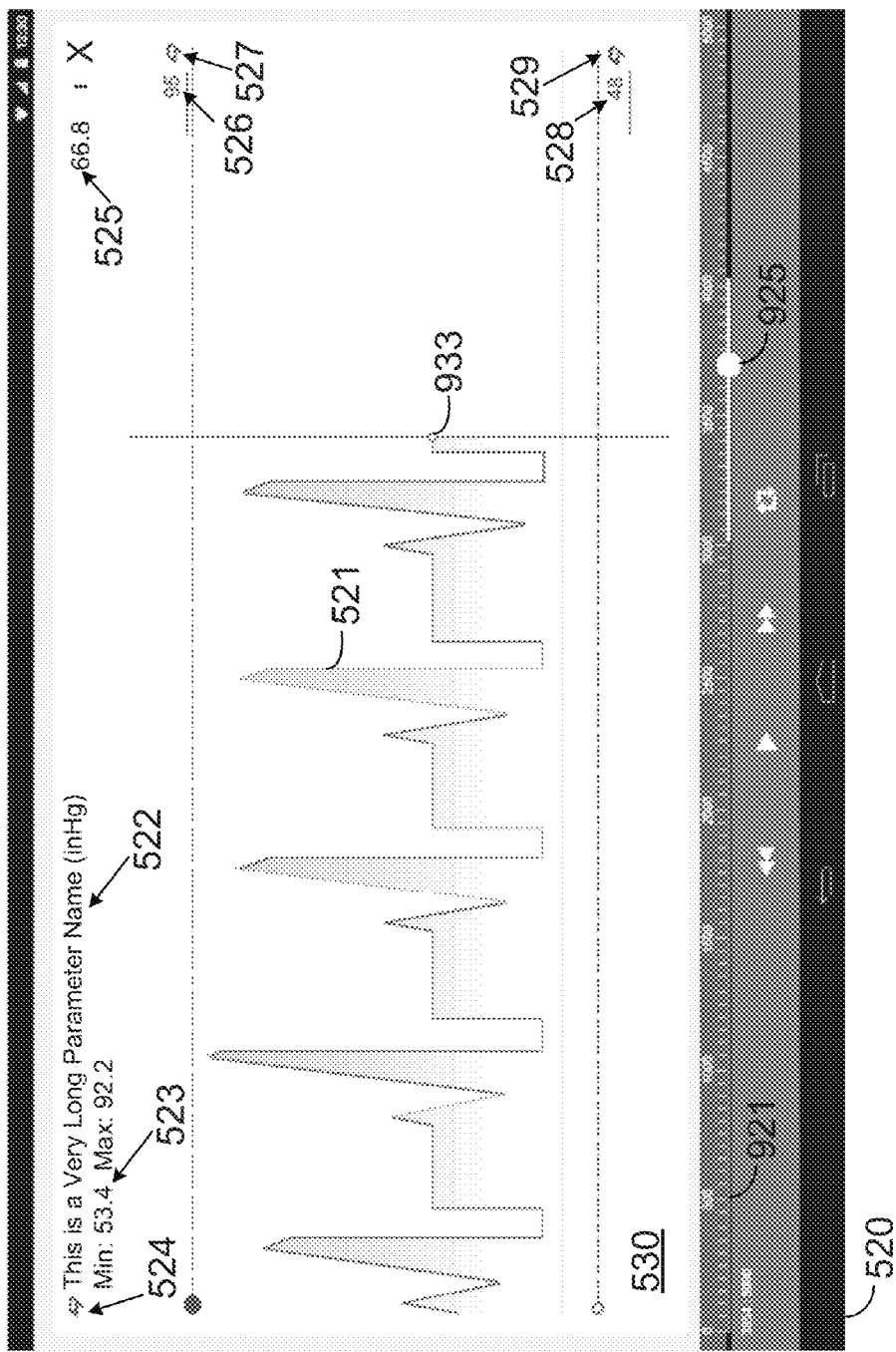

Next, FIG. 17 is a diagram depicting an example display presentation 520 that can be provided by a display such as the display 302. The DP 520 includes a VDP graph window 530 including a VDP line graph 521 for a VDP identified by the VDP graph text 522. The VDP graph window 530 includes the time-based indicator 921, the cursor positioner 925, and the cursor 933. The VDP graph window 530 includes a digital VDP value 525 that indicates a value of the VDP at the cursor 933. The VDP graph window includes minimum and maximum values 523 that can indicate the minimum and maximum values of the VDP displayed in the VDP line graph 521 or of the VDP stored in the VDP 224 for the VDP identified by the VDP graph text 522.

The VDP graph window 530 includes a threshold arm status icon 524. The threshold arm status icon 524 can include an empty flag icon (e.g., VOC indicator 780) when a threshold for the VDP indicated by the VDP graph text 522 is not armed. The processor 202 may not compare data values of the received VDP to a VDP threshold when the threshold is not armed. The VDP graph window 530 includes a lower threshold indicator 528 that indicates a numeric value of the lower threshold of the VDP displayed in the VDP graph window 530. The VDP graph window 530 includes an upper threshold indicator 526 that indicates a numeric value of the upper threshold of the VDP displayed in the VDP graph window 530. The VDP graph window 530 includes a VOC indicator 527 associated with the upper threshold of the VDP and a VOC indicator 529 associated with the lower threshold of the VDP. Any one more other VDP graph windows described herein can include one or more of the elements included within the DP 520.

Figure 18:

Next, FIG. 18 is a diagram depicting an example display presentation 550 that can be provided by a display such as the display 302. The DP 550 includes the VDP graph windows 530, 551, 552, 553, 554, and 555. The VDP graph windows 530, 551, 553, 554, and 555 include VDP line graphs for the VDP identified by the VDP graph text in each of those VDP graph windows. The VDP graph window 530 includes the VDP line graph 521, an upper threshold indicator 559, and a lower threshold indicator 560, a VDP graph text 558 that identifies a PID of the VDP data values displayed by the VDP line graph 521, and the threshold arm status icon 524. In the DP 550, the threshold arm status icon 557 can include a solid (i.e., un-empty) flag of a first icon color (e.g., blue) to indicate that the VDP threshold associated with the VDP represented by the VDP line graph 521 is armed, but not breached.

The VDP graph window 552 includes a digital value 556 of a VDP value of a VDP that is identified by the VDP graph text in the VDP graph window 552. The digital value 556 can be the same color as the text of the VDP graph text 558 when the VDP threshold associated with the VDP represented by the VDP line graph 521 is armed, but not breached. The DP 550 includes the time-based indicator 921 and the cursor positioner 925. Any one more other VDP graph windows described herein can include one or more of the elements included within the DP 550.

Figure 19:
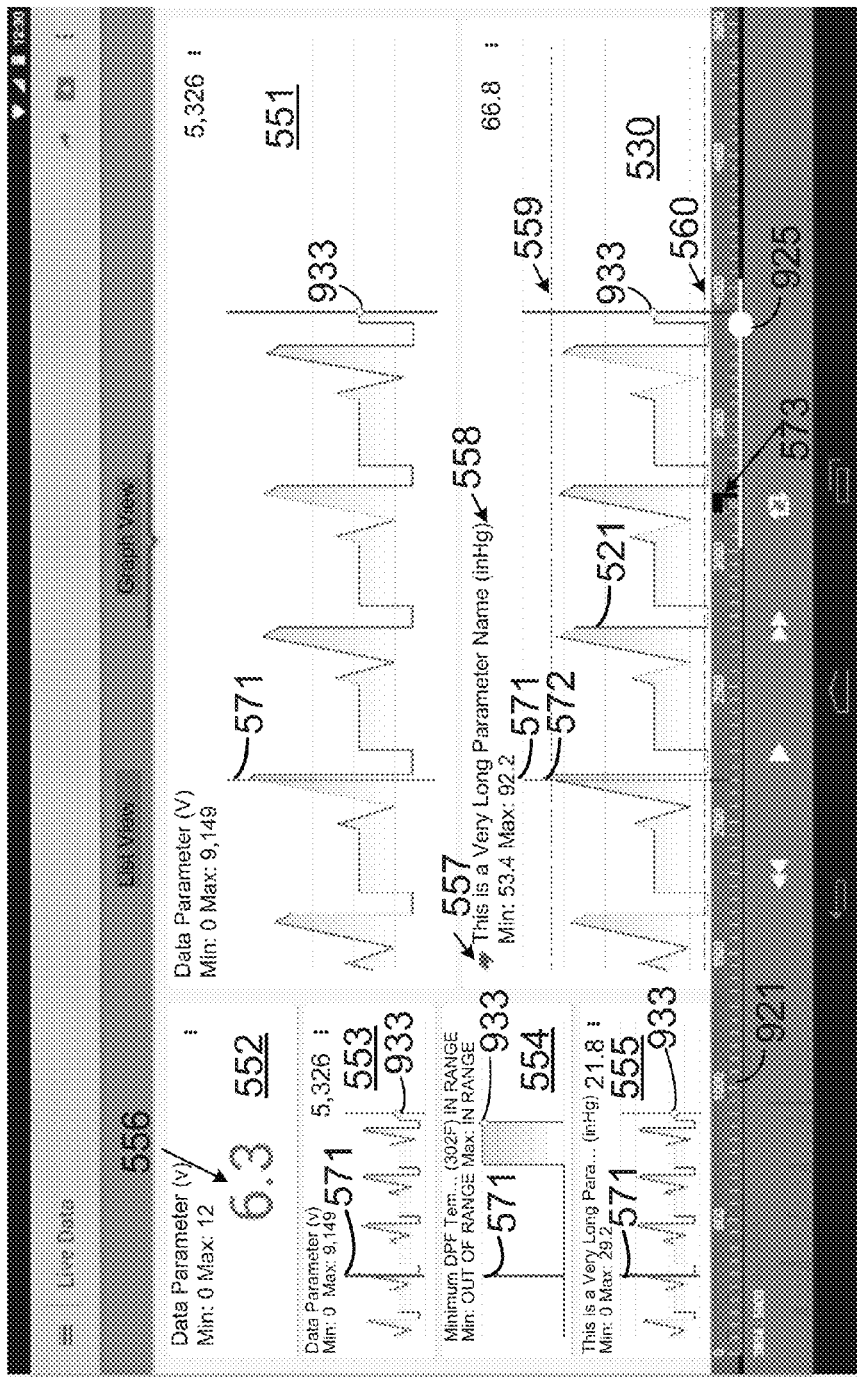

Next, FIG. 19 is a diagram depicting an example display presentation 570 that can be provided by a display such as the display 302. The DP 570 includes the VDP graph windows 530, 551, 552, 553, 554, and 555. Similar to FIG. 18, the VDP graph windows 530, 551, 553, 554, and 555 include VDP line graphs for the VDP identified by the VDP graph text in each of those VDP graph windows. The VDP graph window 530 includes the VDP line graph 521, the upper threshold indicator 559, and the lower threshold indicator 560, the VDP graph text 558, and the threshold arm status icon 557. In the DP 570, the threshold arm status icon 557 can include a solid (i.e., un-empty) flag of a second icon color (e.g., red) to indicate that the VDP threshold associated with the VDP represented by the VDP line graph 521 is armed and has been breached at the VDP value 572 of the VDP line graph 521.

The value and color of the digital value 556 within the VDP graph window 552 can change as the cursor positioner 925 is repositioned. For example, the color of the digital value 556 can be the same as the first color of the threshold arm status icon 557 when the VDP threshold associated with that icon is not breached and can be the same as the second color of the threshold arm status icon 557 when the VDP threshold associated with that icon is breached. In one respect, the color of the digital value 556 can be the second color if the cursor positioner 925 is positioned at position representing a time when the VDP threshold was initially breached. In another respect, the color of the digital value can be the second color if the cursor positioner 925 is positioned at a position representing any time when the VDP threshold remained breached. The VDP graph text within the VDP graph window can be the same as color of the digital value 556. The DP 570 includes the time-based indicator 921 and the cursor positioner 925.

Upon a VDP threshold being breached, a VOC indicator 573 can be displayed in proximity to the time-based indicator 921. When the VOC indicator 573 is displayed in proximity to the time segment 923, the VDP value 572 is displayed within the VDP graph window 530 along with a VOC indicator bar 571. VOC indicator bars 571 are also displayed within the VDP graph windows 551, 553, 554, and 555 to indicate a location with those VDP graph windows that corresponds to a time at which the VDP threshold was breached at the VDP value 572. Any one more other VDP graph windows described herein can include one or more of the elements included within the DP 570.

Next, FIG. 20 is a diagram depicting an example display presentation 585 that can be provided by a display such as the display 302. The DP 585 includes the VDP graph windows 586, 587, 588, 589, 590, and 591, the time-based indicator 921, the time segments 922, 923, and 924, and the cursor positioner 925. FIG. 20 represents a case in which the cursor positioner 925 is positioned at a first end 595 of the time segment 923. With the cursor positioner at the first end 595, a line graph within the VDP graph window 586 extends completely from a first end 592 to a second end 593 of the VDP graph window 586. As the cursor positioner 925 is moved from the first end 595 of the time segment 923 towards a second end 594 of the time segment 923, the amount of the VDP graph window covered by the line graph is reduced. The movement of the cursor positioner 925 can cause uniform movement of the other VDP line graphs shown in FIG. 20. Any one more other VDP graph windows described herein can include one or more of the elements included within the DP 585.

V. Example Computer-Readable Medium

As indicated above, the data storage device 204 includes CRPI 218. Accordingly, a computer-readable medium can store program instructions, that when executed by a computing device (e.g., the processor 202), cause multiple sets of functions to be performed. For purposes of this description, these sets of functions are referred to herein as "the X set of example functions," where X represents an ordinal number such as first, second, etc.

As an example, a first set of example functions can include: (i) determining, by a processor, a display is operating in a first display orientation, wherein the first display orientation is associated with the display displaying vehicle data parameter (VDP) graphs using a first VDP graph configuration, (ii) displaying, by the display, a first set of multiple VDP graphs using the first VDP graph configuration while the display is positioned in the first display orientation, (iii) determining, by the processor, the display changing from operating in the first display orientation to operating in a second display orientation that is different than the first display orientation, wherein the second display orientation is associated with the display displaying at least one VDP graph using a second VDP graph configuration different than the first VDP graph configuration, and (iv) displaying, by the display, at least one VDP graph using the second VDP graph configuration while the display is operating in the second display orientation.

As another example, a second set of example functions can include: (i) receiving, by a device, a selection of a vehicle operating condition detectable by the device, (ii) receiving, by the device, vehicle data parameters, (iii) determining, by the device from among the vehicle data parameters, a first instance of a particular vehicle data parameter that indicates occurrence of the vehicle operating condition, (iv) displaying, by the device, a graphical representation of at least a portion of the vehicle data parameters received by the device, and (v) displaying, by the device, a first indicator that corresponds to the first instance of the particular vehicle data parameter that indicates occurrence of the vehicle operating condition.

As another example, a third set of example functions can include: (i) receiving, by a device, multiple vehicle data parameters associated with a first vehicle data parameter (VDP) identifier and multiple vehicle data parameters associated with a second VDP identifier, (ii) displaying, by a display of the device, a first graphical representation showing at least a portion of the vehicle data parameters associated with the first VDP identifier at a first display position of the display, (iii) displaying, by the display of the device, a second graphical representation showing at least a portion of the vehicle data parameters associated with the second VDP identifier at a second display position of the display, and (iv) receiving, by the device, a drag-and-drop input of the first graphical representation displayed at the first display position onto at least a portion of the second display position displaying the second graphical representation and responsively changing the graphical representations displayed at the first display position and the second display position, wherein changing the graphical representations displayed at the first display position and the second display position includes switching the second display position to display the first graphical representation instead of the second graphical representation.

As another example, a fourth set of example functions can include: (i) receiving, by a device, multiple vehicle data parameters associated with a first vehicle data parameter (VDP) identifier and multiple vehicle data parameters associated with a second VDP identifier, (ii) displaying, by a display of the device, a first VDP graph showing at least a portion of the vehicle data parameters associated with the first VDP identifier, (iii) displaying, by the display of the device, a second VDP graph showing at least a portion of the vehicle data parameters associated with the second VDP identifier, and (iv) receiving, by the device, a pinch-andexpand input of the first VDP graph and responsively increasing a size of the first VDP graph.

As another example, a fifth set of example functions can include: (i) displaying, by a display of a device, a plurality of vehicle data parameter (VDP) graphs within the display, wherein each VDP graph includes at least one cursor, (ii) displaying, by the display, a cursor positioner within the display, wherein the cursor positioner is configured for a cursor positioner movement that causes a uniform movement of at least one cursor within each VDP graph, (iii) determining, by the device, an occurrence of the cursor positioner movement, and (iv) moving uniformly, by the device, the at least one cursor within each VDP graph in response to determining the occurrence of the cursor positioner movement.

As another example, the set of example functions can include one or more of the functions of any of the first, second, third, fourth or fifth set of example sets of function listed above and at least one other function of any of the functions described in this description as being performed by a VST, or any component of a VST.

VI. Conclusion

Example embodiments have been described above. Those skilled in the art will understand that changes and modifications can be made to the described embodiments without departing from the true scope and spirit of the present invention, which is defined by the claims. For instance, although many of the example embodiments are described with respect to a vehicle and a vehicle service tool, the person skilled in the art will understand that the vehicle referred to herein can be replaced by some other serviceable device such as, but not limited to, medical equipment, appliances (e.g., refrigerators or washing machines), or televisions. In such instance, the vehicle service tools described herein can be referred to more simply as a "service tool."

We claim:

1. A method comprising:
  determining, by at least one processor, a display is operating in a first display orientation,
    wherein the first display orientation is associated with the display displaying multiple vehicle data parameter (VDP) graphs using a first VDP graph configuration,
    wherein the first VDP graph configuration indicates a first quantity of VDP graph windows to be displayed, and
    wherein the first VDP graph configuration includes at least one large VDP graph window and at least two small VDP graph windows;
  displaying, by the display, the first quantity of VDP graphs using the first VDP graph configuration while the display is positioned in the first display orientation;
  determining, by the at least one processor, the display changing from operating in the first display orientation to operating in a second display orientation that is different than the first display orientation,
    wherein the second display orientation is associated with the display displaying at least one VDP graph using a second VDP graph configuration different than the first VDP graph configuration,
    wherein the second VDP graph configuration indicates a second quantity of VDP graph windows to be displayed, and wherein the first quantity differs from the second quantity,
    wherein the second VDP graph configuration includes at least one large VDP graph window and at least two small VDP graph windows, and
    wherein, in response to determining the display changing from operating in the first display orientation to the second display orientation, the display changes from displaying a first VDP graph using a first large VDP graph window of the at least one large VDP graph window of the first VDP graph configuration to displaying the first VDP graph using a first small VDP graph window of the at least two small VDP graph windows of the second VDP graph configuration, and the display changes from displaying a second VDP graph using a first small VDP graph window of the at least two small VDP graph windows of the first VDP graph configuration to displaying the second VDP graph using a first large VDP graph window of the at least one large VDP graph windows of the second VDP graph configuration; and
  displaying, by the display, the second quantity of VDP graphs using the second VDP graph configuration while the display is operating in the second display orientation,
  wherein the first display orientation comprises one of a landscape orientation and a portrait orientation, and the second display orientation comprises the other one of the landscape orientation and the portrait orientation.

2. The method of claim 1, wherein displaying the second quantity of VDP graphs using the second VDP graph configuration includes displaying multiple VDP graphs.

3. The method of claim 1,
  wherein a first dimension of the display is longer than a second dimension of the display,
  wherein the first dimension is perpendicular to the second dimension,
  wherein the first display orientation includes the first dimension being horizontal,
  wherein the second display orientation includes the second dimension being horizontal,
  wherein the first VDP graph configuration includes the at least one large VDP graph window of the first VDP graph configuration positioned on left sides or right sides of the at least two small VDP graph windows of the first VDP graph configuration, and
  wherein the second VDP graph configuration includes the at least one large VDP graph window of the second VDP graph configuration positioned above or below the at least two small VDP graph windows of the second VDP graph configuration.

4. The method of claim 1, further comprising:
  receiving, by the at least one processor, an input to scroll a portion of the display at which the at least two small VDP graph windows of the first VDP graph configuration are displayed; and
  scrolling, by the display in response to the at least one processor receiving the input to scroll, the portion of the display at which the at least two small VDP graph windows of the first VDP graph configuration are displayed.

5. The method of claim 4, wherein scrolling the portion of the display at which the at least two small VDP graph windows of the first VDP graph configuration are displayed includes displaying at least one small VDP graph not displayed in any of the at least two small VDP graph windows of the first VDP graph configuration at a time the scrolling is initiated and removing at least one small VDP graph displayed in one of the at least two small VDP graph windows of the first VDP graph configuration at the time the scrolling is initiated.

6. The method of claim 1, further comprising:
receiving, by the at least one processor, an input to scroll a portion of the display at which the at least one large VDP graph window of the first VDP graph configuration is displayed; and
scrolling, by the display in response to the at least one processor receiving the input to scroll, the portion of the display at which the at least one large VDP graph window of the first VDP graph configuration is displayed.

7. The method of claim 6, wherein scrolling the portion of the display at which the at least one large VDP graph window of the first VDP graph configuration is displayed includes displaying at least one large VDP graph not displayed in any of the at least one large VDP graph window of the first VDP graph configuration at a time the scrolling is initiated and removing at least one large VDP graph displayed in one of the at least one large VDP graph window of the first VDP graph configuration at the time the scrolling is initiated.

8. The method of claim 1, wherein displaying the second quantity of VDP graphs using the second VDP graph configuration while the display is operating in the second display orientation includes displaying a single VDP graph covering an area of the display covered by the first set of multiple VDP graphs using the first VDP graph configuration while the display is positioned in the first display orientation.

9. The method of claim 1, further comprising:
displaying, by the display, a VDP selector while the display is displaying the first quantity of VDP graphs using the first VDP graph configuration, and
selecting, by use of the VDP selector, a different VDP; and
displaying, by the display, the different VDP selected by use of the VDP selector.

10. The method of claim 9, wherein the display comprises a touch screen display.

11. A system comprising:
at least one processor;
a non-transitory computer-readable medium storing computer-readable program instructions executable by the processor; and
a display,
wherein the computer-readable program instructions are executable by the at least one processor to:
(i) determine the display is operating in a first display orientation,
wherein the first display orientation is associated with the display displaying multiple vehicle data parameters (VDP) graphs using a first VDP graph configuration,
wherein the first VDP graph configuration indicates a first quantity of VDP graph windows to be displayed, and
wherein the first VDP graph configuration includes at least one large VDP graph window and at least two small VDP graph windows;
(ii) display, by the display, the first quantity of VDP graphs using the first VDP graph configuration while the display is positioned in the first display orientation, (iii) determine the display changing from operating in the first display orientation to operating in a second display orientation that is different than the first display orientation,
wherein the second display orientation is associated with the display displaying at least one VDP graph using a second VDP graph configuration different than the first VDP graph configuration,
wherein the second VDP graph configuration indicates a second quantity of VDP graph windows to be displayed, and wherein the first quantity differs from the second quantity,
wherein the second VDP graph configuration includes at least one large VDP graph window and at least two small VDP graph windows, and
wherein, in response to determining the display changing from operating in the first display orientation to the second display orientation, the display changes from displaying a first VDP graph using a first large VDP graph window of the at least one large VDP graph window of the first VDP graph configuration to displaying the first VDP graph using a first small VDP graph window of the at least two small VDP graph windows of the second VDP graph configuration, and the display changes from displaying a second VDP graph using a first small VDP graph window of the at least two small VDP graph windows of the first VDP graph configuration to displaying the second VDP graph using a first large VDP graph window of the at least one large VDP graph windows of the second VDP graph configuration; and
(iv) display, by the display, the second quantity of VDP graph using the second VDP graph configuration while the display is operating in the second display orientation,
wherein the first display orientation comprises one of a landscape orientation and a portrait orientation, and the second display orientation comprises the other one of the landscape orientation and the portrait orientation.

12. The system of claim 11 further comprising:
a data link connector (DLC) connector communicatively connectable to a DLC in a vehicle to receive the multiple vehicle data parameters.

13. The system of claim 11, further comprising:
an orientation detector to provide the at least one processor with a signal the at least one processor uses to determine the display changing from operating in the first display orientation to operating in a second display orientation.

14. The system of claim 13, wherein the orientation detector includes at least one of an accelerometer or a gyroscope.

15. The system of claim 11,
wherein the computer-readable medium stores display orientation data indicating at least one of a screen display resolution, a pixel density, or physical dimensions of the display, and
wherein the at least one processor uses the display orientation data to select the second VDP graph configuration for displaying while the display is operating in the second display orientation.

16. The system of claim 11,
wherein the display comprises a display of a smart phone,
wherein the display displaying the second quantity of VDP graphs using the second VDP graph configuration includes the display displaying a single VDP graph in the landscape orientation.

17. A non-transitory computer-readable medium storing program instructions, that when executed by at least one processor, cause a set of functions to be performed, the set of functions comprising:
  determining, by the at least one processor, a display is operating in a first display orientation,
    wherein the first display orientation is associated with the display displaying multiple vehicle data parameter (VDP) graphs using a first VDP graph configuration,
    wherein the first VDP graph configuration indicates a first quantity of VDP graph windows to be displayed, and
    wherein the first VDP graph configuration includes at least one large VDP graph window and at least two small VDP graph windows;
  displaying, by the display, the first quantity of VDP graphs using the first VDP graph configuration while the display is positioned in the first display orientation;
  determining, by the at least one processor, the display changing from operating in the first display orientation to operating in a second display orientation that is different than the first display orientation,
    wherein the second display orientation is associated with the display displaying at least one VDP graph using a second VDP graph configuration different than the first VDP graph configuration,
    wherein the second VDP graph configuration indicates a second quantity of VDP graph windows to be displayed, and wherein the first quantity differs from the second quantity,
    wherein the second VDP graph configuration includes at least one large VDP graph window and at least two small VDP graph windows, and
    wherein, in response to determining the display changing from operating in the first display orientation to the second display orientation, the display changes from displaying a first VDP graph using a first large VDP graph window of the at least one large VDP graph window of the first VDP graph configuration to displaying the first VDP graph using a first small VDP graph window of the at least two small VDP graph windows of the second VDP graph configuration, and the display changes from displaying a second VDP graph using a first small VDP graph window of the at least two small VDP graph windows of the first VDP graph configuration to displaying the second VDP graph using a first large VDP graph window of the at least one large VDP graph windows of the second VDP graph configuration; and
  displaying, by the display, the second quantity of VDP graph using the second VDP graph configuration while the display is operating in the second display orientation,
  wherein the first display orientation comprises one of a landscape orientation and a portrait orientation, and the second display orientation comprises the other one of the landscape orientation and the portrait orientation.

18. The non-transitory computer-readable medium of claim 17, wherein the set of functions further comprises:
  receiving, by the at least one processor, an input to scroll a portion of the display at which at least two small VDP graph windows of the first VDP graph configuration are displayed; and
  scrolling, by the display in response to the at least one processor receiving the input to scroll, the portion of the display at which the at least two small VDP graph windows of the first VDP graph configuration are displayed.

* * * * *